US012733216B2

(12) United States Patent
Takishita et al.

(10) Patent No.: US 12,733,216 B2
(45) Date of Patent: Sep. 8, 2026

(54) MANUFACTURING METHOD OF FORMING A BUFFER REGION OF SEMICONDUCTOR DEVICE AND SEMICONDUCTOR DEVICE

(71) Applicant: FUJI ELECTRIC CO., LTD., Kanagawa (JP)

(72) Inventors: Hiroshi Takishita, Matsumoto-city (JP); Yuusuke Ooshima, Matsumoto-city (JP); Takashi Yoshimura, Matsumoto-city (JP); Shuntaro Yaguchi, Matsumoto-city (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 459 days.

(21) Appl. No.: 18/472,175

(22) Filed: Sep. 21, 2023

(65) Prior Publication Data

US 2024/0162284 A1 May 16, 2024

(30) Foreign Application Priority Data

Nov. 14, 2022 (JP) ................................ 2022-182176

(51) Int. Cl.
*H10D 62/10* (2025.01)
*H10D 8/00* (2025.01)
(Continued)

(52) U.S. Cl.
CPC ........... *H10D 62/105* (2025.01); *H10D 8/411* (2025.01); *H10D 12/032* (2025.01);
(Continued)

(58) Field of Classification Search
None
See application file for complete search history.

(56) References Cited

U.S. PATENT DOCUMENTS 10,825,904 B2 * 11/2020 Agata .................... H10D 62/60
2016/0141399 A1 5/2016 Jelinek
(Continued)

FOREIGN PATENT DOCUMENTS

JP 2020027921 A 2/2020
JP 2021141094 A 9/2021
(Continued)

OTHER PUBLICATIONS

US 9,728,627 B2, 08/2017, Jelinek (withdrawn)
US 9,853,137 B2, 12/2017, Jelinek (withdrawn)

*Primary Examiner* — Kyoung Lee

(57) ABSTRACT

A manufacturing method of a semiconductor device including a buffer region in a semiconductor substrate is provided, comprising: obtaining a substrate concentration index related to at least one of an oxygen chemical concentration or a carbon chemical concentration included in the semiconductor substrate; classifying the substrate concentration index as any index range among a predetermined plurality of index ranges; determining an acceleration energy of hydrogen ions to be implanted into the semiconductor substrate to an acceleration energy that is preset to correspond to the classified index range; and forming a buffer region of the semiconductor device by implanting hydrogen ions into the semiconductor substrate with the determined acceleration energy.

28 Claims, 18 Drawing Sheets

(51) Int. Cl.
*H10D 12/00* (2025.01)
*H10D 12/01* (2025.01)
*H10D 62/60* (2025.01)

(52) U.S. Cl.
CPC ......... *H10D 12/441* (2025.01); *H10D 62/124* (2025.01); *H10D 62/60* (2025.01)

(56) References Cited

U.S. PATENT DOCUMENTS

| | | | |
|---|---|---|---|
| 2016/0329401 | A1 | 11/2016 | Laven |
| 2017/0062568 | A1 | 3/2017 | Caspary |
| 2017/0103882 | A1 | 4/2017 | Freund |
| 2018/0122895 | A1 | 5/2018 | Jelinek |
| 2020/0058506 | A1 | 2/2020 | Nakamura |
| 2021/0273053 | A1 | 9/2021 | Suzuki |
| 2022/0059680 | A1 | 2/2022 | Chen |
| 2022/0115522 | A1 | 4/2022 | Otsuka |
| 2022/0140118 | A1 | 5/2022 | Nakamura |
| 2022/0262638 | A1 | 8/2022 | Nakamura |
| 2022/0285537 | A1 | 9/2022 | Nakamura |

FOREIGN PATENT DOCUMENTS

| | | | |
|---|---|---|---|
| JP | 2022035157 | A | 3/2022 |
| JP | 2022062443 | A | 4/2022 |
| JP | 2022073497 | A | 5/2022 |
| JP | 2022124784 | A | 8/2022 |
| JP | 2022136627 | A | 9/2022 |

* cited by examiner

100

MANUFACTURING METHOD OF FORMING A BUFFER REGION OF SEMICONDUCTOR DEVICE AND SEMICONDUCTOR DEVICE

The contents of the following patent application(s) are incorporated herein by reference:

NO. 2022-182176 filed in JP on Nov. 14, 2022

BACKGROUND

1. Technical Field

The present invention relates to a manufacturing method of a semiconductor device and a semiconductor device.

2. Related Art

Conventionally, a semiconductor device having a buffer region is known (for example, Patent document 1-3).

PRIOR ART DOCUMENTS

Patent Documents

Patent Document 1: Specification of U.S. Patent Application Publication No. 2017/0062568

Patent Document 2: Specification of U.S. Patent Application Publication No. 2018/0122895

Patent Document 3: Specification of U.S. Patent Application Publication No. 2016/0141399

DESCRIPTION OF EXEMPLARY EMBODIMENTS

Figure 1A:
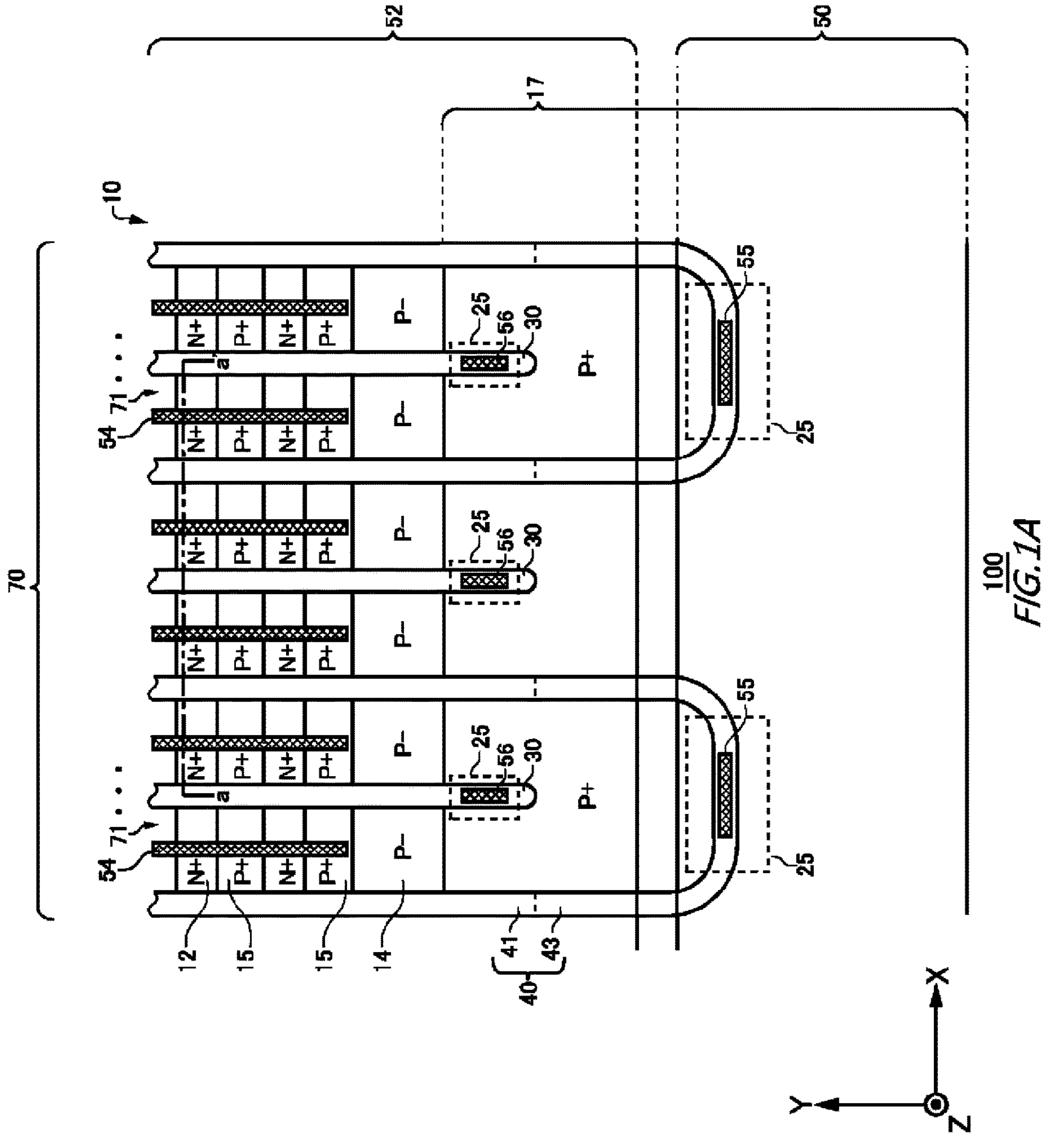
FIG. 1A shows an example of a top view of a semiconductor device 100.

Hereinafter, embodiments of the present invention will be described, but the embodiments do not limit the invention according to the claims. In addition, not all of the combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer, or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes specify relative positions of components, and do not limit a specific direction. For example, the Z axis is not limited to indicate the height direction with respect to the ground. Note that a +Z axis direction and a −Z axis direction are directions opposite to each other. When the Z axis direction is described without the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. This error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor representing a conductivity type of the N type, or a semiconductor representing a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is referred to as $N_D$ and the acceptor concentration is referred to as $N_A$, the net doping concentration at any position is given as $N_D-N_A$. In the present specification, the net doping concentration may be simply referred to as the doping concentration.

The donor has a function of supplying electrons to a semiconductor. The acceptor has a function of receiving electrons from the semiconductor. The donor and acceptor are not limited to the impurities themselves. For example, a VOH defect where vacancy (V), oxygen (O), and hydrogen (H) are attached together, an Si-i-H defect where interstitial silicon (Si-i) and hydrogen are attached together, and a CiOi-H defect where interstitial carbon (Ci), interstitial oxygen (Oi), and hydrogen are attached together that exist in the semiconductor serve as a donor for supplying electrons. In the present specification, these defects may be referred to as hydrogen donors.

A P+ type or an N+ type described in the present specification means a doping concentration higher than that of the P type or the N type, and a P− type or an N− type described herein means a doping concentration lower than that of the P type or the N type. Furthermore, a P++ type or an N++ type described in the present specification means a higher doping concentration than that of the P+ type or the N+ type.

A chemical concentration in the present specification indicates an atomic density of an impurity measured regardless of an electrical activation state. The chemical concentration can be measured by, for example, secondary ion mass spectrometry (SIMS). The net doping concentration described above can be measured by capacitance-voltage profiling method (CV method). Furthermore, a carrier concentration measured by a spreading resistance profiling method (SRP method) may be set as the net doping concentration. A carrier means an electron charge carrier or a hole charge carrier. The carrier concentration measured by the CV method or the SRP method may be set as a value in a thermal equilibrium state. Furthermore, in a region of an N type, the donor concentration is sufficiently higher than the acceptor concentration, and therefore, the carrier concentration in the region may be set as the donor concentration. Similarly, in a region of a P type, the carrier concentration in the region may be set as the acceptor concentration. In the present specification, the doping concentration of the N type region may be referred to as the donor concentration, and the doping concentration of the P type region may be referred to as the acceptor concentration.

Furthermore, when a concentration distribution of the donor, acceptor, or net doping has a peak, a value of the peak may be set as the concentration of the donor, acceptor, or net doping in the region. When the concentration of the donor, acceptor, or net doping is approximately uniform in a region, or the like, an average value of the concentration of the donor, acceptor, or net doping in the region may be set as the concentration of the donor, acceptor, or net doping.

The carrier concentration measured by the SRP method may be lower than the concentration of the donor or the acceptor. In a range where a current flows when a spreading resistance is measured, the carrier mobility of the semiconductor substrate may be lower than a value of that in a crystalline state. The fall in carrier mobility occurs when carriers are scattered due to disorder (disorder) of a crystal structure due to a lattice defect or the like. The carrier concentration becomes lower for the following reason. In the SRP method, a spreading resistance is measured, and a carrier concentration is converted from a measurement value of the spreading resistance. At this time, mobility of the crystalline state is used as the carrier mobility. Meanwhile, despite the fact that carrier mobility is reduced at a position where the lattice defect is introduced, the carrier concentration is calculated by using the carrier mobility of the crystalline state. Therefore, a value lower than an actual carrier concentration, i.e., a concentration of donors or acceptors, is obtained.

The concentration of the donor or the acceptor calculated from the carrier concentration measured by the CV method or the SRP method may be lower than a chemical concentration of an element representing the donor or the acceptor. As an example, in a silicon semiconductor, a donor concentration of phosphorus or arsenic serving as a donor or an acceptor concentration of boron (boron) serving as an acceptor is substantially 99% of chemical concentrations of these. On the other hand, in the silicon semiconductor, a donor concentration of hydrogen serving as a donor is approximately 0.1% to 10% of a chemical concentration of hydrogen. In the present specification, an SI unit system is adopted. In the present specification, a unit of a distance or length may be represented by cm (centimeter). In this case, various calculations may be converted into m (meter) to be calculated. As for numeric representation of power of 10, for example, the representation 1E+16 indicates $1\times10^{16}$, and the representation 1E−16 indicates $1\times10^{-16}$.

FIG. 1A shows an example of the top view of a semiconductor device 100. The semiconductor device 100 in this example is a semiconductor chip that includes a transistor portion 70.

The transistor portion 70 is a region obtained by projecting a collector region 22 provided in a back surface side of a semiconductor substrate 10 onto an upper surface of the semiconductor substrate 10. The collector region 22 will be described below. The transistor portion 70 includes transistors such as IGBTs. In this example, the transistor portion 70 is an IGBT. It is noted that the transistor portion 70 may be other transistors such as a MOSFET.

This figure shows a surrounding region of a chip end portion on an edge side of the semiconductor device 100, and other regions are omitted. For example, an edge termination structure portion may be provided in a region in a negative side of the Y axis direction in the semiconductor device 100 in this example. The edge termination structure portion is to relax an electric field strength in the upper surface side of the semiconductor substrate 10. The edge termination structure portion includes, for example, a guard ring, a field plate, or a RESURF structure, or combinations thereof. Note that although this example describes the edge in the negative side in the Y axis direction for convenience, the same applies to other edges of the semiconductor device 100.

The semiconductor substrate 10 is a substrate that is formed of a semiconductor material. The semiconductor substrate 10 may be a silicon substrate, a silicon carbide substrate, or a nitride semiconductor substrate or the like such as a gallium nitride semiconductor substrate. The semiconductor substrate 10 in this example is a silicon substrate. The semiconductor substrate 10 may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), and a float zone method (FZ method). It is to be noted that when referred to as a top view in the present specification, it means that the upper surface side of the semiconductor substrate 10 is viewed from above. As will be described later, the semiconductor substrate 10 includes a front surface 21 and a back surface 23.

The semiconductor device 100 of this example includes, at the front surface 21 of the semiconductor substrate 10, a gate trench portion 40, a dummy trench portion 30, an emitter region 12, a base region 14, a contact region 15 and a well region 17. In addition, the semiconductor device 100 of this example includes an emitter electrode 52 and a gate metal layer 50 provided above the front surface 21 of the semiconductor substrate 10.

The emitter electrode 52 is provided above the gate trench portion 40, the dummy trench portion 30, the emitter region 12, the base region 14, the contact region 15, and the well region 17. In addition, the gate metal layer 50 is provided above the gate trench portion 40 and the well region 17.

The emitter electrode 52 and the gate metal layer 50 are formed of a material including metal. At least a partial region of the emitter electrode 52 may be formed of metal such as aluminum (Al) or a metal alloy such as an aluminum-silicon alloy (AlSi) and an aluminum-silicon-copper alloy (AlSiCu). At least a partial region of the gate metal layer 50 may be formed of metal such as aluminum (Al) or a metal alloy such as an aluminum-silicon alloy (AlSi) and an aluminum-silicon-copper alloy (AlSiCu). The emitter electrode 52 and the gate metal layer 50 may include a barrier metal formed of titanium, titanium compound, or the like under the region formed of aluminum or the like. The emitter electrode 52 and the gate metal layer 50 are provided separately from each other.

The emitter electrode 52 and the gate metal layer 50 are provided above the semiconductor substrate 10 to sandwich an interlayer dielectric film 38. The interlayer dielectric film 38 is omitted in FIG. 1A. A contact hole 54, a contact hole 55, and a contact hole 56 are provided through the interlayer dielectric film 38.

The contact holes 55 connect the gate metal layer 50 and the gate conductive portions inside the transistor portions 70. A plug metal layer formed of tungsten or the like may be formed inside the contact hole 55.

The contact hole 56 connects the emitter electrode 52 with a dummy conductive portion in a dummy trench portion 30. A plug metal layer formed of tungsten or the like may be formed inside the contact hole 56.

A connection portion 25 is connected to an electrode on the side of the front surface, such as an emitter electrode 52 or the gate metal layer 50. In an example, the connection portion 25 is provided between the gate metal layer 50 and the gate conductive portion. The connection portion 25 is also provided between the emitter electrode 52 and the dummy conductive portion. The connection portion 25 is formed of a conductive material such as polysilicon doped with impurities. The connection portion 25 of this example is polysilicon doped with an N type impurity (N+). The connection portion 25 is provided above the front surface 21 of the semiconductor substrate 10 via an insulating film such as an oxide film, or the like.

The gate trench portions 40 are an example of a plurality of trench portions extending in a predetermined extending direction on the front surface 21 side of the semiconductor substrate 10. The gate trench portions 40 are arranged at predetermined intervals along a predetermined arrangement direction (the X axis direction in this example). The gate trench portion 40 of this example may include: two extending portions 41 which extends along an extending direction (the Y axis direction in this example) parallel to the front surface 21 of the semiconductor substrate 10 and perpendicular to the arrangement direction; and a connection portion 43 which connects two extending portions 41.

At least a part of the connection portion 43 is preferably formed in a curved shape. By connecting end portions of the two extending portions 41 of the gate trench portions 40, an electric field strength at the end portions of the extending portions 41 can be reduced. At the connection portion 43 of the gate trench portion 40, the gate metal layer 50 may be connected to the gate conductive portion.

The dummy trench portions 30 are an example of the plurality of trench portions extending in the predetermined extending direction on the front surface 21 side of the semiconductor substrate 10. The dummy trench portion 30 is a trench portion that is electrically connected to the emitter electrode 52. The dummy trench portion 30 is arranged, similarly to the gate trench portion 40, at a predetermined interval along a predetermined arrangement direction (the X axis direction in this example). Although the dummy trench portion 30 of this example has an I shape on the front surface 21 of the semiconductor substrate 10, it may have a U shape on the front surface 21 of the semiconductor substrate 10 as in the gate trench portion 40. That is, the dummy trench portion 30 may include two extending portions which extend along the extending direction and a connection portion which connects the two extending portions.

The transistor portion 70 in this example has a repetitive array structure of two gate trench portions 40 and two dummy trench portions 30. That is, the transistor portion 70 in this example includes the gate trench portions 40 and the dummy trench portions 30 at a ratio of 1:1. For example, the transistor portion 70 includes one dummy trench portion 30 between two extending portions 41.

It is noted however that the ratio of the gate trench portions 40 and the dummy trench portions 30 is not limited to this example. The ratio of the gate trench portions 40 may be larger than the ratio of the dummy trench portions 30, or the ratio of the dummy trench portions 30 may be larger than the ratio of the gate trench portions 40. The ratio of the gate trench portions 40 and the dummy trench portions 30 may be 2:3 or may be 2:4. Alternatively, with all trench portions being the gate trench portions 40, the transistor portion 70 does not need to include the dummy trench portion 30.

The well region 17 is a region of a second conductivity type which is provided in a front surface 21 side of the semiconductor substrate 10 relative to a drift region 18 which will be described below. The well region 17 is an example of the well region provided in the edge side of the semiconductor device 100. The well region 17 is of the P+ type as an example. The well region 17 is formed within a predetermined range from an end portion of the active region in a side in which the gate metal layer 50 is provided. A diffusion depth of the well region 17 may be deeper than depths of the gate trench portion 40 and the dummy trench portion 30. Partial regions of the gate trench portion 40 and the dummy trench portion 30 in the gate metal layer 50 side are formed in the well region 17. The bottoms at the end of the extending direction of the gate trench portion 40 and the dummy trench portion 30 may be covered by the well region 17.

The contact hole 54 is formed above each region of the emitter region 12 and the contact region 15 in the transistor portion 70. The contact hole 54 is not provided above the well region 17 provided at both ends of the Y axis direction. In this way, one or more contact holes 54 are formed in the interlayer dielectric film. The one or more contact holes 54 may be provided to extend in the extending direction.

A mesa portion 71 is a mesa portion provided in direct contact with the trench portion in a plane parallel to the front surface 21 of the semiconductor substrate 10. The mesa portion is a portion of the semiconductor substrate 10 interposed between two trench portions adjacent to each other, and may be a portion ranging from the front surface 21 of the semiconductor substrate 10 to the depth of the lowermost bottom portion of each trench portion. The extending portions of each trench portion may be regarded as one trench portion. That is, the region sandwiched between two extending portions may be set to be a mesa portion.

The mesa portion 71 is provided in direct contact with at least one of the dummy trench portion 30 or the gate trench portion 40 in the transistor portion 70. The mesa portion 71 includes the well region 17, the emitter region 12, the base region 14, and the contact region 15 at the front surface 21 of the semiconductor substrate 10. The mesa portion 71 includes the emitter regions 12 and the contact regions 15 alternately provided in the extending direction.

The base region 14 is a region of the second conductivity type provided on the side of the front surface 21 of the semiconductor substrate 10. The base region 14 is of the P− type as an example. The base region 14 may be provided at both end portions of the mesa portion 71 in the Y axis direction, in the front surface 21 of the semiconductor substrate 10. Note that FIG. 1A shows only one end portion of the base region 14 in the Y axis direction.

The emitter region 12 is a region of the first conductivity type having a higher doping concentration than that of the drift region 18. The emitter region 12 in this example is of the N+ type as an example. An example of a dopant of the emitter region 12 includes arsenic (As). The emitter region 12 is provided in contact with the gate trench portion 40 at the front surface 21 in the mesa portion 71. The emitter region 12 may be provided to extend in the X axis direction from one of two trench portions sandwiching the mesa portion 71 to the other of the two trench portions. The emitter region 12 is also provided below the contact hole 54.

In addition, the emitter region 12 may or may not be in contact with the dummy trench portion 30. The emitter region 12 in this example is in contact with the dummy trench portion 30. The contact region 15 is a region of a second conductivity type, which is provided above the base region 14 and has a higher doping concentration than the base region 14. The contact region 15 in this example is of the P+ type as an example. The contact region 15 in this example is provided in the front surface 21 of the mesa portion 71. The contact region 15 may be provided in the X axis direction from one of two trench portions sandwiching the mesa portion 71 to the other of the two trench portions. The contact region 15 may or may not be in contact with the gate trench portion 40 or the dummy trench portion 30. The contact region 15 in this example is in contact with the dummy trench portion 30 and the gate trench portion 40. The contact region 15 is also provided below the contact hole 54.

Figure 1B:
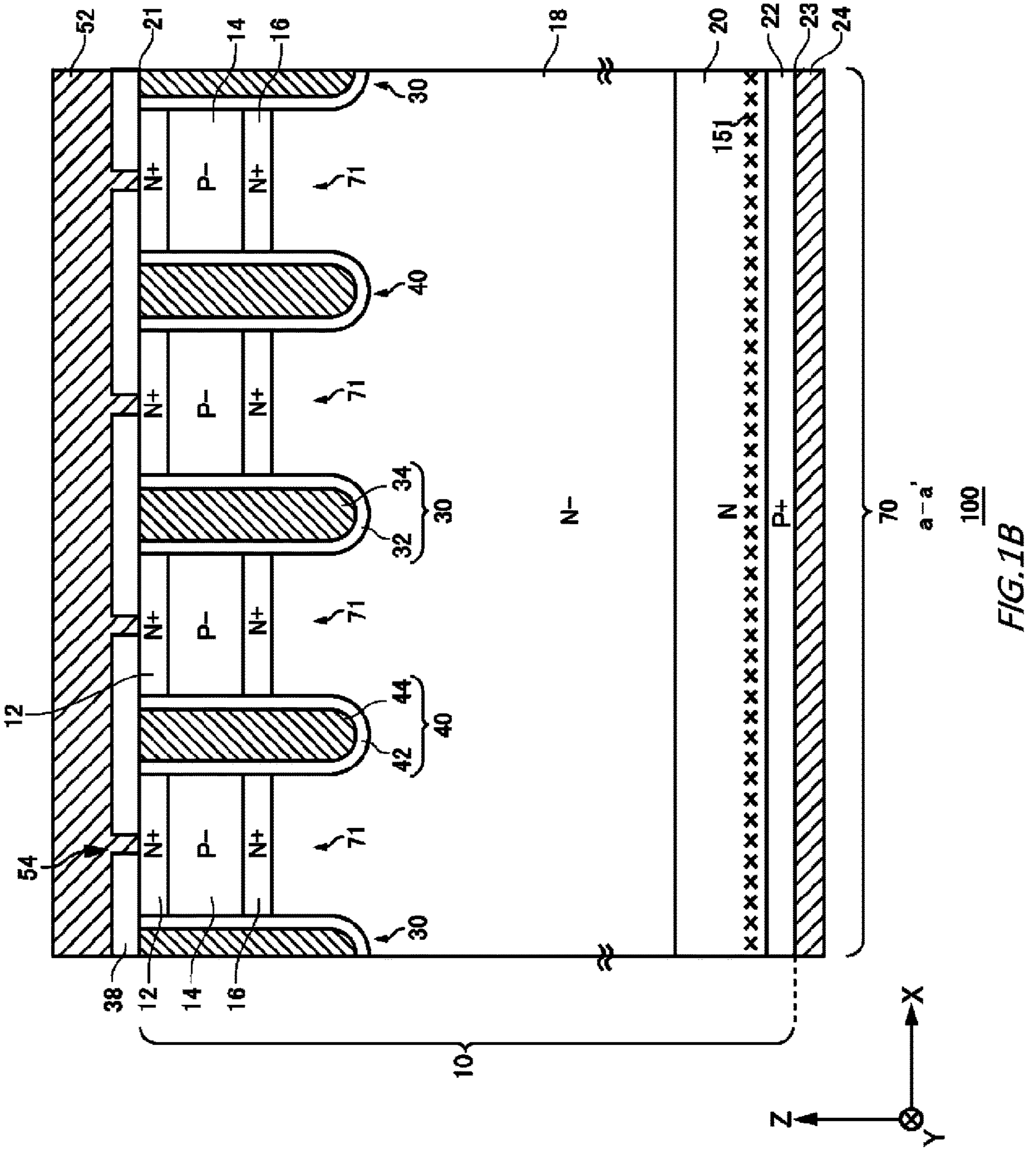
FIG. 1B shows an example of a cross section a-a' in FIG. 1A.

FIG. 1B shows an example of a cross section a-a' in FIG. 1A. The cross section a-a' is an XZ plane passing through the emitter region 12 in the transistor portion 70. In the cross section a-a', the semiconductor device 100 in this example has the semiconductor substrate 10, the interlayer dielectric film 38, the emitter electrode 52, and a collector electrode 24. The emitter electrode 52 is formed above the semiconductor substrate 10 and the interlayer dielectric film 38.

The drift region 18 is a region of the first conductivity type which is provided in the semiconductor substrate 10. The drift region 18 in this example is of the N− type as an example. The drift region 18 may be a region that has remained without other doping regions being formed in the semiconductor substrate 10. That is, the doping concentration of the drift region 18 may be a doping concentration of the semiconductor substrate 10.

A buffer region 20 is a region of the first conductivity type which is provided in a back surface 23 side of the semiconductor substrate 10 relative to the drift region 18. The buffer region 20 in this example is of the N type as an example. The doping concentration of the buffer region 20 is higher than the doping concentration of the drift region 18. The buffer region 20 may function as a field stop layer which prevents a depletion layer extending from a lower surface side of the base region 14 from reaching the collector region 22 of the second conductivity type.

The collector region 22 is provided below the buffer region 20 in the transistor portion 70. The collector region 22 has the second conductivity type. The collector region 22 in this example is of the P+ type as an example.

The collector electrode 24 is formed at a back surface 23 of the semiconductor substrate 10. The collector electrode 24 is formed of a conductive material such as metal. The material of the collector electrode 24 may be the same as or different from the material of the emitter electrode 52.

The base region 14 is a region of the second conductivity type which is provided above the drift region 18. The base region 14 is provided in contact with the gate trench portion 40. The base region 14 may be provided in contact with the dummy trench portion 30.

The emitter region 12 is provided above the base region 14. The emitter region 12 is provided between the base region 14 and the front surface 21. The emitter region 12 is provided in contact with the gate trench portion 40. The emitter region 12 may or may not be in contact with the dummy trench portion 30.

The accumulation region 16 is a region of the first conductivity type which is provided in the front surface 21 side of the semiconductor substrate 10 relative to the drift region 18. The accumulation region 16 in this example is of the N+ type as an example. It is noted however that the accumulation region 16 may not be provided.

The accumulation region 16 is provided in contact with the gate trench portion 40. The accumulation region 16 may be or may not be in contact with the dummy trench portion 30. The doping concentration of the accumulation region 16 is higher than the doping concentration of the drift region 18. An ion implantation dose amount of the accumulation region 16 may be more than or equal to 1.0E+12 $cm^{-2}$ and less than or equal to 1.0E+13 $cm^{-2}$. Alternatively, the ion implantation dose amount of the accumulation region 16 may be more than or equal to 3.0E+12 $cm^{-2}$ and less than or equal to 6.0E+12 $cm^{-2}$. Providing the accumulation region 16 can enhance the carrier injection enhancement effect (IE effect) to reduce an ON voltage of the transistor portion 70.

One or more gate trench portions 40 and one or more dummy trench portions 30 are provided at the front surface 21. Each trench portion is provided from the front surface 21 to the drift region 18. In a region where at least any of the emitter region 12, the base region 14, the contact region 15, or the accumulation region 16 is provided, each trench portion also penetrates through these regions to reach the drift region 18. The configuration of the trench portion passing through the doping region is not limited to that manufactured in the order of forming the doping region and then forming the trench portion. The configuration of the trench portion passing through the doping region also includes a configuration of the doping region being formed between the trench portions after forming the trench portions.

The gate trench portion 40 has a gate trench, a gate dielectric film 42, and a gate conductive portion 44 which are formed in the front surface 21. The gate dielectric film 42 is formed to cover an inner wall of the gate trench. The gate dielectric film 42 may be formed by oxidizing or nitriding a semiconductor on the inner wall of the gate trench. The gate dielectric film 44 is formed in the interior of the gate trench, and the gate conductive portion 44 is formed inside the gate dielectric film 42. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 for the front surface 21.

The gate conductive portion 44 includes a region opposing the adjacent base region 14 in the mesa portion 71 side by sandwiching the gate dielectric film 42 in a depth direction of the semiconductor substrate 10. When a predetermined voltage is applied to the gate conductive portion 44, a channel is formed to a surface layer being at a boundary within the base region 14 and in direct contact with the gate trench, due to an electron inversion layer.

The dummy trench portion 30 may have the same structure as the gate trench portion 40. The dummy trench portion 30 has a dummy trench, a dummy dielectric film 32, and a dummy conductive portion 34 which are formed in the front surface 21 side. The dummy dielectric film 32 is formed covering the inner walls of the dummy trench. The dummy conductive portion 34 is formed in the interior of the dummy trench and also formed inside the dummy dielectric film 32. The dummy dielectric film 32 insulates the dummy conductive portion 34 from the semiconductor substrate 10. The dummy trench portion 30 is covered by the interlayer dielectric film 38 in the front surface 21.

The interlayer dielectric film 38 is provided above the semiconductor substrate 10. The interlayer dielectric film 38 of this example is provided in contact with the front surface 21. The emitter electrode 52 is provided above the interlayer dielectric film 38. In the interlayer dielectric film 38, one or more contact holes 54 are provided for electrically connecting the emitter electrode 52 to the semiconductor substrate 10. Similarly, the contact hole 55 and the contact hole 56 may be provided to pass through the interlayer dielectric film 38. The interlayer dielectric film 38 may be a BPSG (Boro-phospho Silicate Glass) film, may be a BSG (borosilicate glass) film, may be a PSG (Phosphosilicate glass) film, may be an HTO film, or may be a film obtained by stacking these materials. A thickness of the interlayer dielectric film 38 is, for example, 1.0 μm, but is not limited to this.

A first lifetime control region 151 may be provided on the transistor portion 70. However, the first lifetime control region 151 may be omitted. The first lifetime control region 151 is a region where a lifetime killer has intentionally been formed by implanting an impurity inside the semiconductor substrate 10, or the like. As an example, the first lifetime control region 151 is formed by implanting helium into the semiconductor substrate 10. By providing the first lifetime control region 151, a turn-off time can be reduced, and by suppressing a tail current, losses during switching can be reduced. The first lifetime control region 151 may not be provided on the transistor portion 70.

The lifetime killer is a recombination center of carriers. The lifetime killer may be a lattice defect. For example, the lifetime killer may be a vacancy, a divacancy, a defect complex of these with elements configuring the semiconductor substrate 10, or dislocation. Furthermore, the lifetime killer may be a noble gas element such as helium and neon, a metal element such as platinum, or the like. An electron beam may be used for forming the lattice defect.

A lifetime killer concentration is a concentration at the recombination center of carriers. The lifetime killer concentration may be a concentration of the lattice defect. For example, the lifetime killer concentration may be a vacancy concentration of a vacancy, a divacancy, or the like, may be a defect complex concentration of these vacancies with elements configuring the semiconductor substrate 10, or may be a dislocation concentration. Alternatively, the lifetime killer concentration may be a chemical concentration of the noble gas element such as helium and neon, or may be a chemical concentration of the metal element such as platinum.

The first lifetime control region 151 is provided in the back surface 23 side relative to the center of the semiconductor substrate 10 in the depth direction of the semiconductor substrate 10. The first lifetime control region 151 in this example is provided in the buffer region 20. The first lifetime control region 151 in this example is provided at an entire surface of the semiconductor substrate 10 in the XY plane, and can be formed without using a mask. The first lifetime control region 151 may be provided in a part of the semiconductor substrate 10 in the XY plane. The dose amount of the impurity to form the first lifetime control region 151 may be more than or equal to 0.5E+10 $cm^{-2}$ and less than or equal to 1.0E+13 $cm^{-2}$, or may be more than or equal to 5.0E+10 $cm^{-2}$ and less than or equal to 5.0E+11 $cm^{-2}$.

The first lifetime control region 151 may be formed through the implantation from the side of the back surface 23. With this configuration, an impact on the side of the front surface 21 of the semiconductor device 100 can be avoided. For example, the first lifetime control region 151 is formed by irradiating helium from the back surface 23 side. Herein, which of the front surface 21 side and the back surface 23 side the implantation is performed from for forming the first lifetime control region 151 can be determined by acquiring a state of the front surface 21 side by an SRP method or a measurement of a leakage current.

Figure 2A:
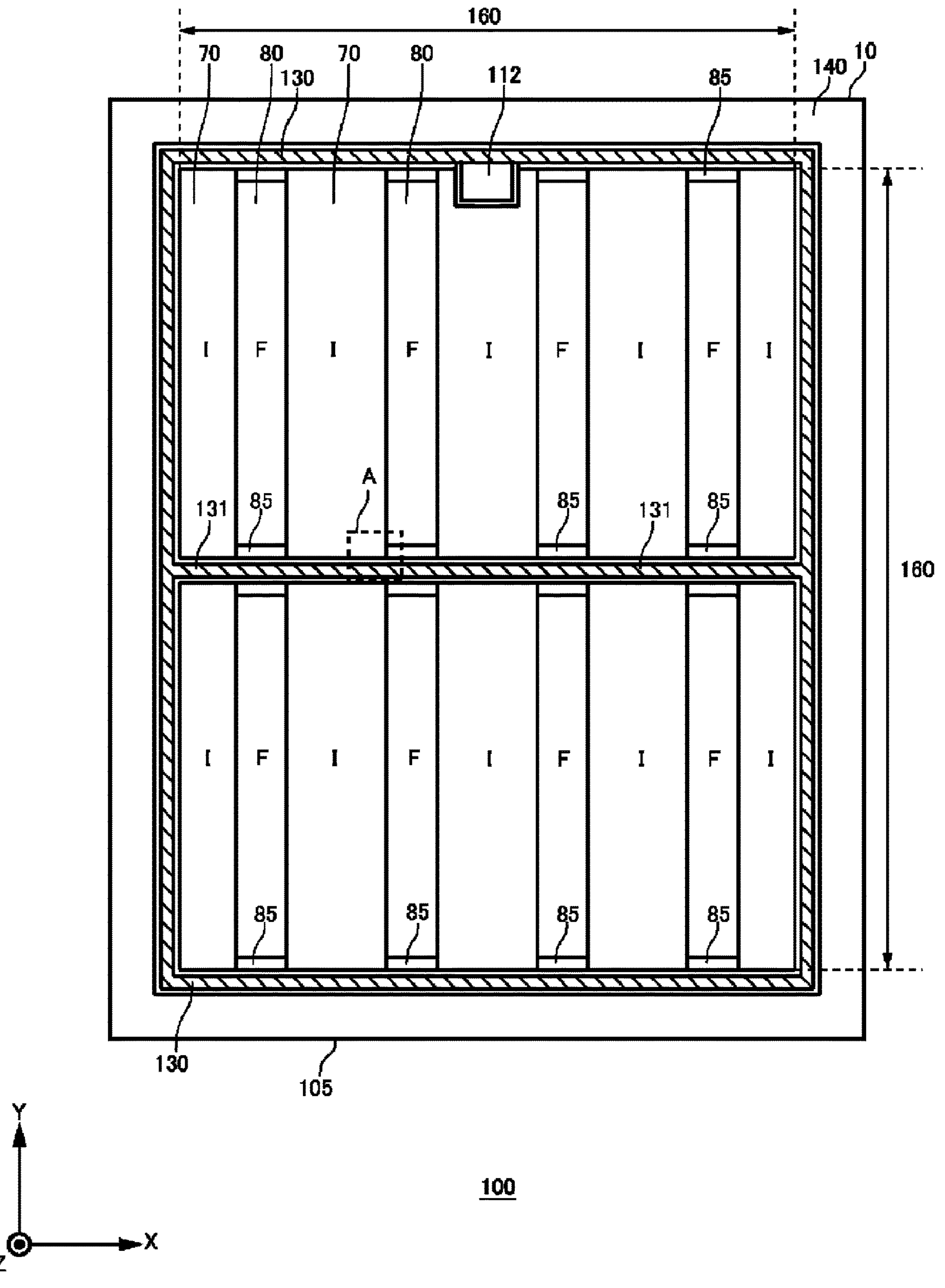
FIG. 2A is an example of a top view showing a modification example of the semiconductor device 100.

FIG. 2A is an example of a top view showing a modification example of the semiconductor device 100. FIG. 2A shows a position at which each member is projected on an upper surface of a semiconductor substrate 10. FIG. 2A shows merely some members of the semiconductor device 100, and omits some members.

The semiconductor substrate 10 has an end side 105 in a top view. The semiconductor substrate 10 of this example includes two sets of end sides 105 facing each other in a top view. In FIG. 2A, the X axis and the Y axis are parallel to any of the end sides 105.

The semiconductor substrate 10 is provided with an active portion 160. The active portion 160 is a region where a principal current flows in the depth direction between the front surface 21 and the back surface 23 of the semiconductor substrate 10 when the semiconductor device 100 operates. An emitter electrode 52 is provided above the active portion 160, but is omitted in FIG. 2A.

The active portion 160 is provided with at least one of a transistor portion 70 including a transistor element such as an IGBT, or a diode portion 80 including a diode portion such as a free wheeling diode (FWD). The semiconductor device 100 of this example is an RC-IGBT including the transistor portion 70 and the diode portion 80. In the example of FIG. 2A, the transistor portion 70 and the diode portion 80 are alternately arranged along a predetermined arrangement direction (the X axis direction in this example) on the front surface 21 of the semiconductor substrate 10. The active portion 160 in another example may be provided with only one of the transistor portion 70 and the diode portion 80.

In this figure, a region where the transistor portion 70 is arranged is denoted by a symbol "I", and a region where the diode portion 80 is arranged is denoted by a symbol "F". Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described below may be the same.

The diode portion 80 includes a cathode region of N+ type in a region in contact with the back surface 23 of the semiconductor substrate 10. In the present specification, a region where the cathode region is provided is referred to as the diode portion 80. In other words, the diode portion 80 is a region that overlaps with the cathode region in the top view. On the back surface 23 of the semiconductor substrate 10, a P+ type of collector region 22 may be provided in a region other than the cathode region. In the present specification, the diode portion 80 may also include an extension region 85 where the diode portion 80 extends to a gate runner to be described later in the Y axis direction. The collector region 22 is provided on the back surface 23 of the extension region 85.

The semiconductor device 100 may have one or more pads above the semiconductor substrate 10. The semiconductor device 100 of this example has a gate pad 112. The semiconductor device 100 may have a pad such as an anode pad, a cathode pad, and a current detection pad. Each pad is arranged in the vicinity of the end side 105. The vicinity of the end side 105 refers to a region between the end side 105 and the emitter electrode 52 in a top view. When the semiconductor device 100 is mounted, each pad may be connected to an external circuit via a wiring such as a wire.

A gate potential is applied to the gate pad 112. The gate pad 112 is electrically connected to the gate conductive portion 44 of the gate trench portion 40 of the active portion 160. The semiconductor device 100 includes a gate runner that connects the gate pad 112 and the gate trench portion 40. In this figure, the gate runner is hatched with diagonal lines.

The gate runner of this example includes an outer circumferential gate runner 130 and an active-side gate runner 131. The outer circumferential gate runner 130 and the active-side gate runner 131 are an example of the gate metal layer 50. The outer circumferential gate runner 130 is arranged between the active portion 160 and the end side 105 of the semiconductor substrate 10 in the top view. The outer circumferential gate runner 130 of this example encloses the active portion 160 in the top view. A region enclosed by the outer circumferential gate runner 130 in the top view may be the active portion 160. In addition, the outer circumferential gate runner 130 is connected to the gate pad 112. The outer circumferential gate runner 130 is arranged above the semiconductor substrate 10. The outer circumferential gate runner 130 may be a metal wiring containing aluminum or the like.

The active-side gate runner 131 is provided in the active portion 160. By providing the active-side gate runner 131 in the active portion 160, it is possible to reduce a variation in wiring length from the gate pad 112 in each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each of the divided regions.

Further, the semiconductor device 100 may include a temperature sensing portion (not shown) that is a PN junction diode formed of polysilicon or the like, or a current detection portion (not shown) that simulates an operation of the transistor portion provided in the active portion 160.

An edge termination structure portion 140 is provided on the front surface 21 of the semiconductor substrate 10. The edge termination structure portion 140 is provided between the active portion 160 and the end side 105 in the top view. The edge termination structure portion 140 of this example is arranged between the outer circumferential gate runner 130 and the end sides 105. The edge termination structure portion 140 reduces electric field strength at the side of the front surface 21 of the semiconductor substrate 10. The edge termination structure portion 140 may include at least one of a guard ring, a field plate, or a RESURF which is annularly provided to enclose the active portion 160.

Figure 2B:
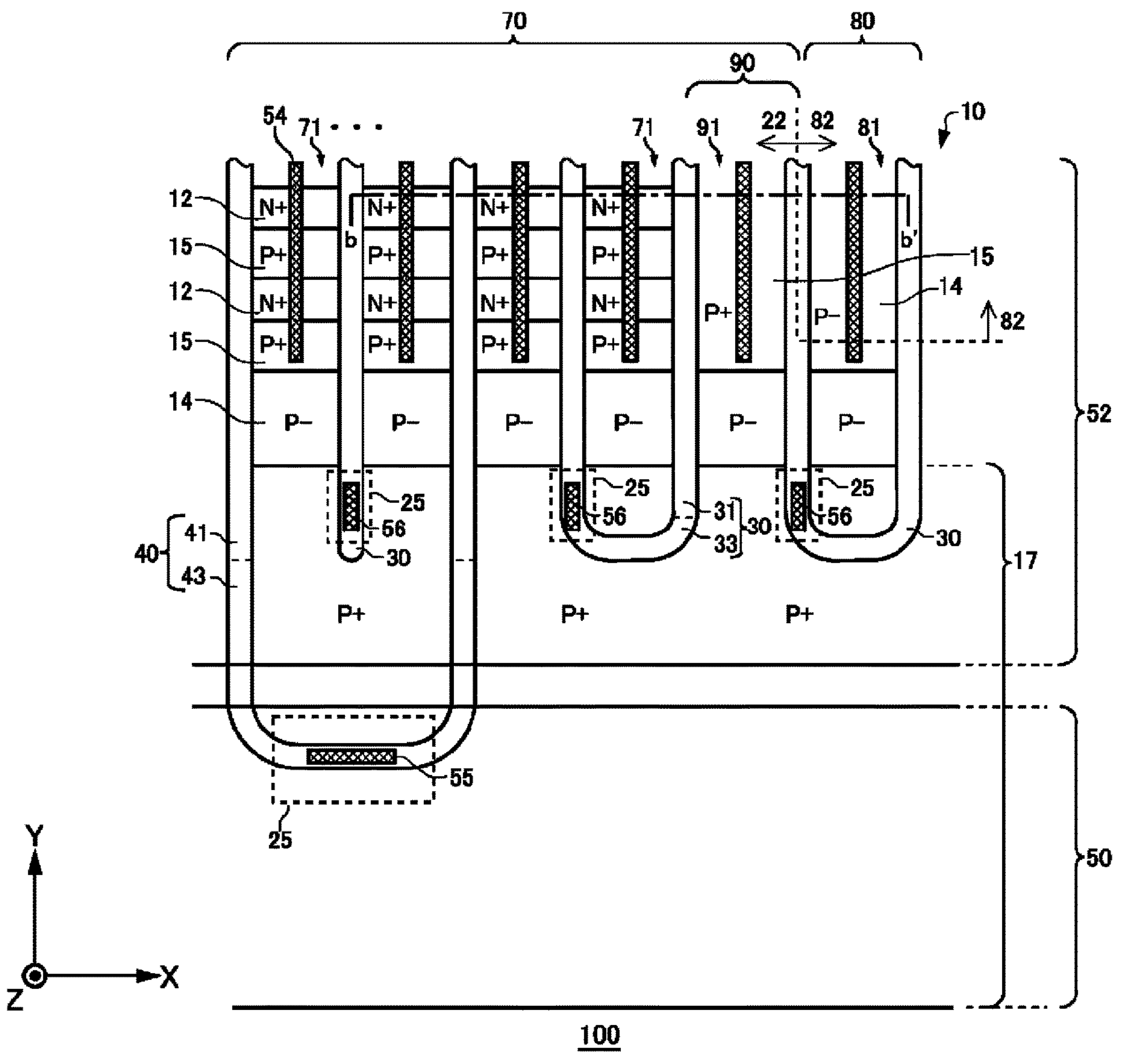
FIG. 2B is an enlarged view of a region A in FIG. 2A.

FIG. 2B is an enlarged view of a region A in FIG. 2A. The region A is a region including the transistor portion 70 and the diode portion 80. The diode portion 80 is a region where the cathode region 82 provided on the side of the back surface 23 of the semiconductor substrate 10 is projected on the upper surface of the semiconductor substrate 10. The semiconductor device 100 of this example includes the gate trench portion 40, the dummy trench portion 30, the emitter region 12, the base region 14, the contact region 15, and the well region 17, which are provided inside the semiconductor substrate 10 on the upper surface side. The gate trench portion 40 and the dummy trench portion 30 each are an example of the trench portion.

Similar to the gate trench portion 40, the dummy trench portion 30 of this example may have a U shape on the front surface 21 of the semiconductor substrate 10. That is, the dummy trench portion 30 may include two extending portions 31 which extend along the extending direction and a connection portion 33 which connects two extending portions 31.

The semiconductor device 100 of this example includes the emitter electrode 52 and the gate metal layer 50 provided above the front surface 21 of the semiconductor substrate 10. The emitter electrode 52 and the gate metal layer 50 are provided separately from each other. The transistor portion 70 of this example includes a boundary region 90 positioned on the boundary between the transistor portion 70 and the diode portion 80. However, the semiconductor device 100 may not include the boundary region 90.

The boundary region 90 is a region which is provided in the transistor portion 70 and which is in direct contact with the diode portion 80. The boundary region 90 has the contact region 15. The boundary region 90 in this example does not have the emitter region 12. In an example, the trench portion of the boundary region 90 is the dummy trench portion 30.

The boundary region 90 of this example is arranged such that both ends in the X axis direction are the dummy trench portions 30.

The contact hole 54 is provided above the base region 14 in the diode portion 80. The contact hole 54 is provided above the contact region 15 in the boundary region 90. No contact holes 54 are provided above the well regions 17 provided at the both ends in the Y axis direction. The mesa portion 91 is provided in the boundary region 90. The mesa portion 91 includes the contact region 15 at the front surface 21 of the semiconductor substrate 10. The mesa portion 91 of this example includes the base region 14 and the well region 17 in the negative direction of the Y axis.

The mesa portion 81 is provided in a region sandwiched between the dummy trench portions 30 adjacent to each other in the diode portion 80. The mesa portion 81 includes the contact region 15 at the front surface 21 of the semiconductor substrate 10. The mesa portion 81 in this example includes the base region 14 and the well region 17 on the negative side of the Y axis direction.

The emitter region 12 is provided in the mesa portion 71, but does not need to be provided in the mesa portion 81 and the mesa portion 91. The contact region 15 is provided in the mesa portion 71 and the mesa portion 91, but does not need to be provided in the mesa portion 81.

Figure 2C:
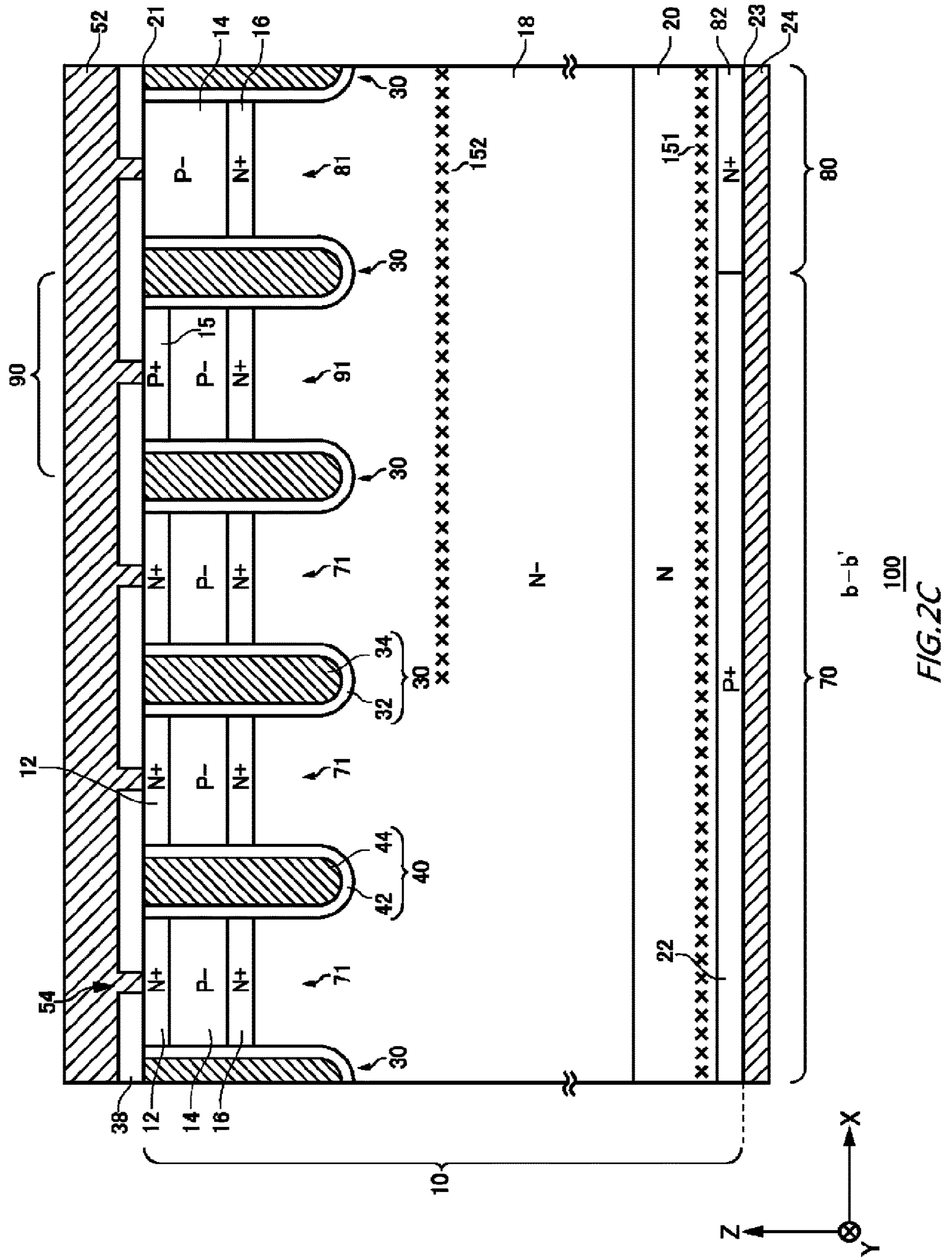
FIG. 2C shows a b-b' cross section of a modification example of the semiconductor device 100.

FIG. 2C shows a b-b' cross section of a modification example of the semiconductor device 100. This figure corresponds to the b-b' cross section of FIG. 2B. The semiconductor device 100 in this example includes the first lifetime control region 151 and a second lifetime control region 152. However, the semiconductor device 100 may not include one of the first lifetime control region 151 or the second lifetime control region 152, and may not include both of the first lifetime control region 151 and the second lifetime control region 152.

The contact region 15 is provided above the base region 14 in the mesa portion 91. The contact region 15 is provided in contact with the dummy trench portion 30 in the mesa portion 91. In another XZ cross section, the contact region 15 may be provided on the front surface 21 of the mesa portion 71.

The accumulation region 16 is provided in the transistor portion 70 and the diode portion 80. The accumulation region 16 in this example is provided at entire surfaces of the transistor portion 70 and the diode portion 80. It is to be noted that the accumulation region 16 does not need to be provided in the diode portion 80.

The cathode region 82 is provided below the buffer region 20 in the diode portion 80. The boundary between the collector region 22 and the cathode region 82 is a boundary between the transistor portion 70 and the diode portion 80. In other words, the collector region 22 is provided below the boundary region 90 of this example.

The first lifetime control region 151 is provided in both the transistor portion 70 and the diode portion 80. With this configuration, in the semiconductor device 100 in this example, a recovery speed in the diode portion 80 can be raised, and a switching loss can be further improved. The first lifetime control region 151 may be formed by a method similar to that of the first lifetime control region 151 in other examples.

The second lifetime control region 152 is provided in the front surface 21 side relative to the center of the semiconductor substrate 10 in the depth direction of the semiconductor substrate 10. The second lifetime control region 152 in this example is provided in the drift region 18. The second lifetime control region 152 is provided in both the transistor portion 70 and the diode portion 80. The second lifetime control region 152 may be formed by implanting an impurity from the front surface 21 side, or may be formed by implanting an impurity from the back surface 23 side. The second lifetime control region 152 is provided at the diode portion 80 and the boundary region 90, and may not be provided at a part of the transistor portion 70.

The second lifetime control region 152 may be formed by any method among the methods for forming the first lifetime control region 151. Elements, dose amounts, and the like for forming the first lifetime control region 151 and the second lifetime control region 152 may be the same or may be different.

Figure 3:
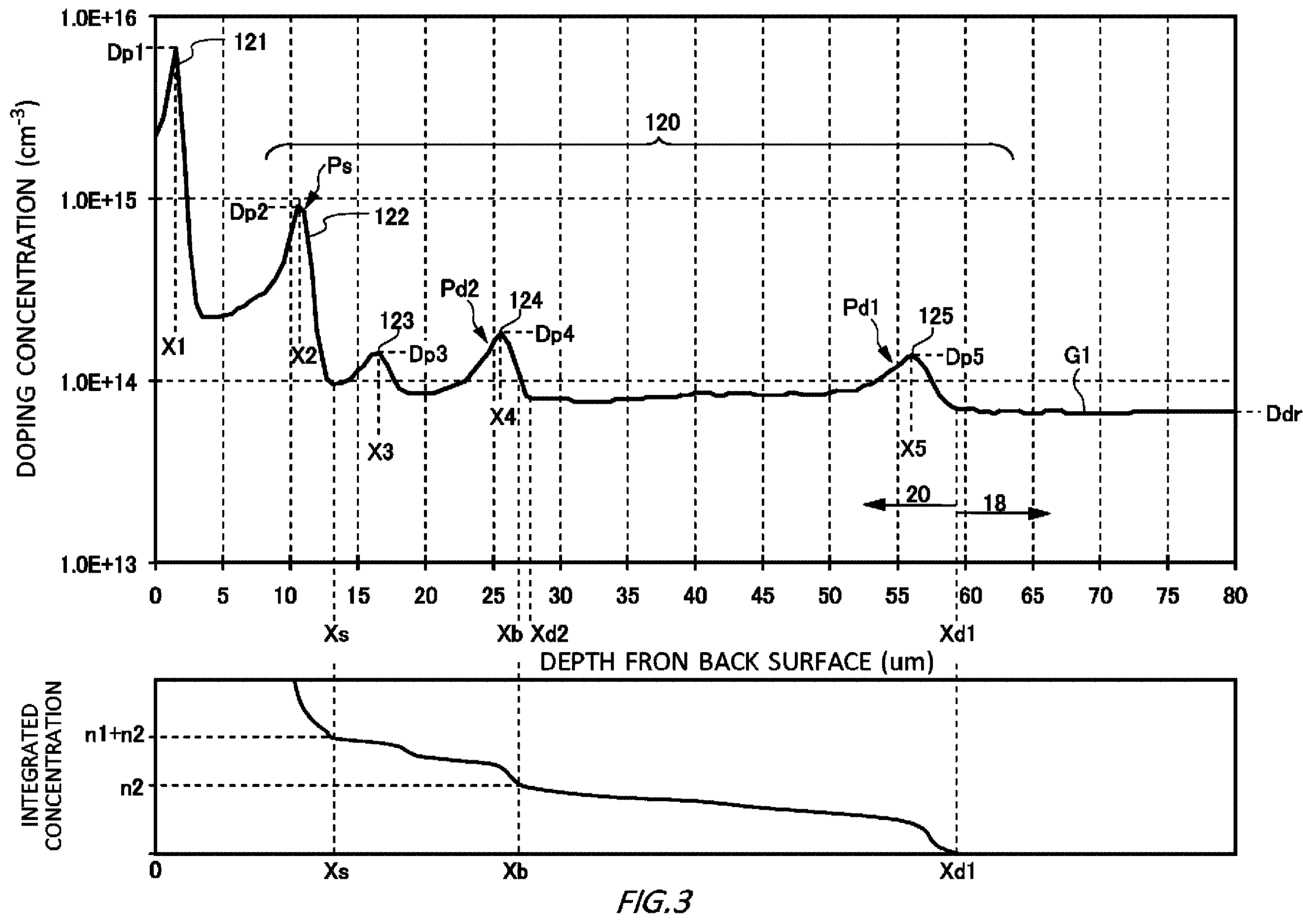
FIG. 3 shows an example of a doping concentration distribution of a buffer region 20.

FIG. 3 shows an example of a doping concentration distribution of the buffer region 20. In this figure, the integrated concentration of the buffer region 20 is shown such that it is aligned with the doping concentration distribution. The graph G1 is an example of the doping concentration distribution of the buffer region 20 having five peaks.

The buffer region 20 has a plurality of peaks. The buffer region 20 of this example has five peaks: a first peak 121, a second peak 122, a third peak 123, a fourth peak 124, and a fifth peak 125. The number of peaks of the buffer regions 20 is not limited thereto. The plurality of peaks may serve as a field stop layer for stopping a depletion layer spreading from the side of the lower surface of the base region 14.

Each peak of the buffer region 20 may be formed by a same dopant, or may be formed by different dopants. The dopant of all the peaks of the buffer region 20 may be hydrogen. In other words, all the peaks of the buffer region 20 may have hydrogen donors. The first peak 121 may be formed through ion implantation of phosphorus or arsenic, and other peaks may be formed through ion implantation of hydrogen ions. The hydrogen ions may be at least one of protons, dutrons, or triton. In this example, hydrogen ions are a proton.

The first peak 121, the second peak 122, the third peak 123, the fourth peak 124, and the fifth peak 125 are provided in this order from the back surface 23 in the depth direction of the semiconductor substrate 10. In other words, the depth position X1-X5 of the first peak 121, the second peak 122, the third peak 123, the fourth peak 124, and the fifth peak 125 meets $X1<X2<X3<X4<X5$. It is noted that, in the present specification, the depth position of the peak may be the distance, from the back surface 23, of the position where the doping concentration indicates local maximal value.

The thickness of the depth direction of the buffer region 20 may be more than or equal to 5 μm and less than or equal to 85 μm. The depth position X1 may be more than 0 μm and less than or equal to 10 μm. The depth position X2 may be more than or equal to 1 μm and may be less than or equal to 30 μm. The depth position X3 may be more than or equal to 5 μm and may be less than or equal to 50 μm. The depth position X4 may be more than or equal to 10 μm and may be less than or equal to 70 μm. The depth position X5 may be more than or equal to 15 μm and may be less than or equal to 85 μm.

The doping concentration Dp1 to doping concentration Dp5 are the doping concentrations of the first peak 121 to fifth peak 125, respectively. The doping concentration Dp1 of the first peak 121 may be higher than the doping concentrations of other peaks of the buffer region 20. The doping concentration Dp2 of the second peak 122 may be lower than the doping concentration Dp1 of the first peak 121, and may be higher than the doping concentration of other peaks other than the first peak 121. The doping concentration Dp5 may be the doping concentration that is the smallest in the buffer region 20.

The peak group 120 has a plurality of peaks provided at a depth position that is more than 10 μm or more from the back surface 23 of the semiconductor substrate 10. The peak group 120 may have three or more peaks. The peak group 120 of this example has four peaks, that is, the second peak 122, the third peak 123, the fourth peak 124, and the fifth peak 125, but is not limited thereto.

A standard peak Ps is the peak closest to the back surface 23 among the peak group 120. The standard peak Ps of this example is the second peak 122. The standard peak Ps is used to calculate an integrated concentration ratio Nr described below.

A depth position Xs is the depth position of the end portion on the side of the front surface of the standard peak Ps. The end portion on the side of the front surface of the standard peak Ps may be the position with the smallest doping concentration between the standard peak Ps and the peak that is adjacent on the side of the front surface of the standard peak Ps.

The first deepest peak Pd1 is the peak closest to the front surface 21 of the semiconductor substrate 10 among the peak group 120. In other words, the first deepest peak Pd1 may be provided in contact with the drift region 18. The first deepest peak Pd1 of this example is the fifth peak 125.

A depth position Xd1 is the depth position of the end portion on the side of the front surface of the first deepest peak Pd1. The end portion on the side of the front surface of the first deepest peak Pd1 may be the position where the doping concentration is the doping concentration of the drift region 18.

A depth position Xb is the position that is 30% from the standard peak Ps among the distances between the standard peak Ps and the first deepest peak Pd1 in the depth direction of the semiconductor substrate 10. In other words, Xb is defined as the following formula:

$$Xs+(Xd1-Xs)\times 0.3$$

The integrated concentration of the buffer region 20 is the value obtained by integrating the doping concentration along the depth direction of the semiconductor substrate 10 from the upper end of the buffer region 20 toward the back surface 23 of the semiconductor substrate 10. The integrated concentration n1 indicates the integrated concentration of the doping concentration from the depth position Xs to Xb. The integrated concentration n2 indicates the integrated concentration of the doping concentration from the depth position Xb to Xd1. The doping concentration at the upper end of the buffer region 20 may be a doping concentration Ddr of the drift region.

The depth position Xd2 is the depth position of the end portion on the side of the front surface of the second deepest peak Pd2 that is second closest to the front surface 21 of the semiconductor substrate 10 after the first deepest peak Pd1 among the peak group 120. The depth position Xd2 may be the depth position where the doping concentration is lowest between the second deepest peak Pd2 and the first deepest peak Pd1. The depth position Xd1 and Xd2 may meet the following formula:

$$1<Xd1/Xd2\leq 20.$$

In addition, Xd1 and Xd2 may meet the following formula:

$$1.2\leq Xd1/Xd2\leq 5.$$

The ratio of the depth position Xd1 to the depth position Xd2, that is, the value Xd1/Xd2 obtained by dividing the depth position Xd1 of the first deepest peak by the depth position Xd2 of the second deepest peak may be smaller than 20, may be smaller than 10, may be smaller than 5, or may be smaller than 3. The ratio Xd1/Xd2 may be more than 1, may be more than 1.2, may be more than 1.5, or may be more than 2.

Xd1/Xd2 may be less than or equal to 20, may be less than or equal to 10, may be less than or equal to 5, or may be less than or equal to 3. Xd1/Xd2 may be more than 1, more than or equal to 1.2, may be more than or equal to 1.5, or may be more than or equal to 2.

The value (Dp5/Dp4 in this example) obtained by dividing the peak concentration of the first deepest peak (Dp5 in this example) by the peak concentration of the second deepest peak (Dp4 in this example) may be more than or equal to 0.2, may be more than or equal to 0.5, or may be more than or equal to 0.8. The value (Dp5/Dp4 in this example) obtained by dividing the peak concentration of the first deepest peak (Dp5 in this example) by the peak concentration of the second deepest peak (Dp4 in this example) may be less than or equal to 3, may be less than or equal to 2, or may be less than or equal to 1.5.

Figure 4A:
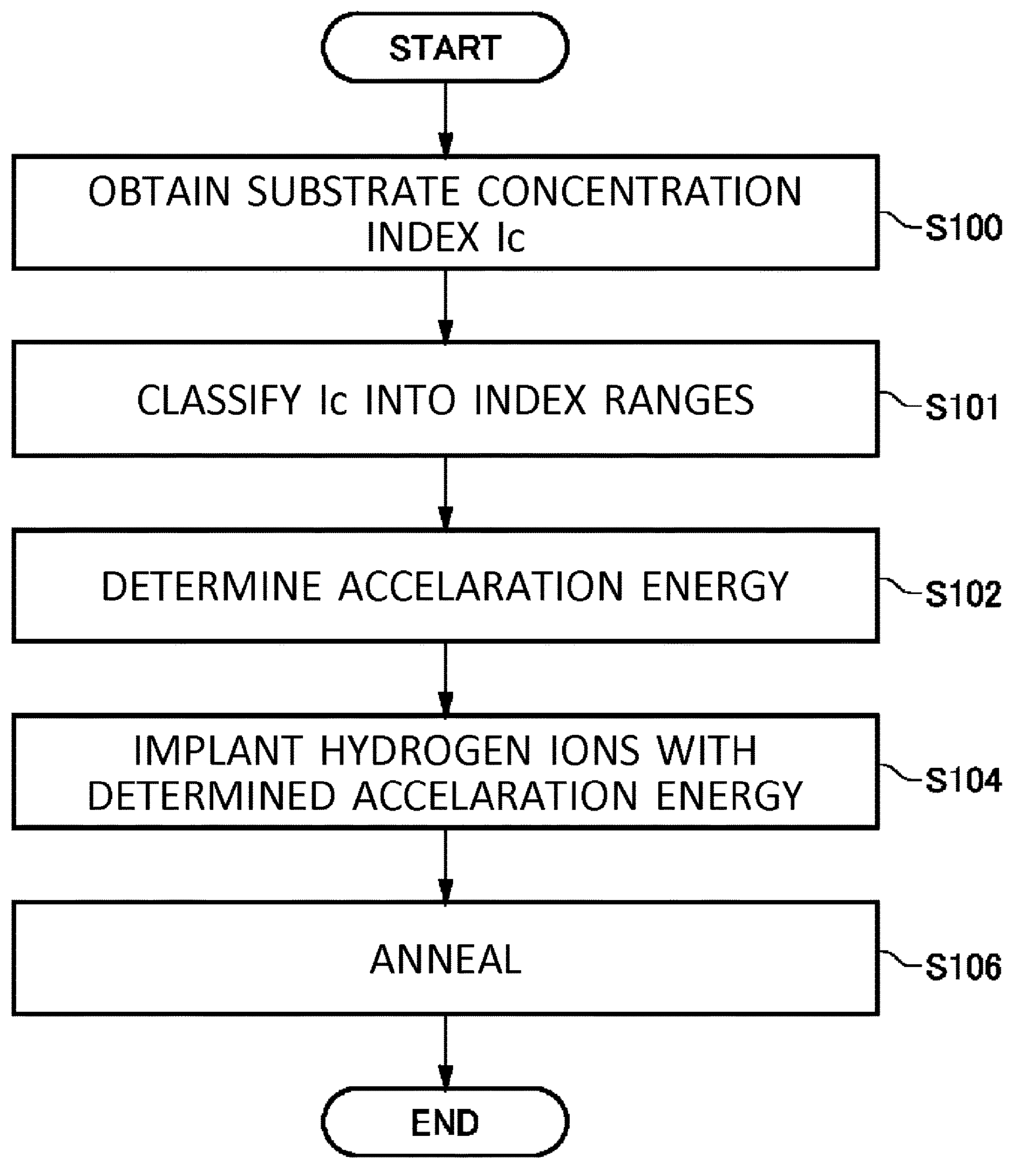
FIG. 4A is a flowchart showing a manufacturing method of the semiconductor device 100.

FIG. 4A is a flowchart showing a manufacturing method of the semiconductor device 100. In this example, an example of a process of implanting hydrogen ions into the semiconductor substrate 10 to form the buffer region 20 is shown.

In the step S100, the substrate concentration index Ic is obtained. The substrate concentration index Ic relates to at least one of the atomic density of oxygen (which may be referred to as oxygen chemical concentration hereinafter) or the atomic density of carbon (which may be referred to as carbon chemical concentration hereinafter) included in the semiconductor substrate 10. The substrate concentration index Ic may be obtained for each semiconductor substrate 10 with different manufacturing method or manufacturing condition. The manufacturing method of the semiconductor substrate 10 being different may refer to the method such as CZ method, MCZ method, or FZ method, etc. being different. The manufacturing condition of the semiconductor substrate 10 being different may refer to the impurity concentration included in the semiconductor substrate 10 being different even with the same manufacturing method. Even for the semiconductor substrates 10 with the same manufacturing method and manufacturing condition, the substrate concentration index Ic may be obtained for each individual.

The substrate concentration index Ic may be defined as the following formula: $(Co\times[\{Cc/(1E15)\}\times\exp(Co/(1E17))])$ $[cm^{-3}]$, wherein the oxygen chemical concentration of the semiconductor substrate 10 is $Co[cm^{-3}]$ and the carbon chemical concentration of the semiconductor substrate 10 is $Cc[cm^{-3}]$. The unit of the substrate concentration index Ic defined in the formula above is $[cm^{-3}]$. The oxygen chemical concentration Co of the semiconductor substrate 10 may be the oxygen chemical concentration of the drift region 18. The carbon chemical concentration Cc of the semiconductor substrate 10 may be the carbon chemical concentration of the drift region 18.

It is noted that the substrate concentration index Ic may be defined as another formula as long as it relates at least one of the oxygen chemical concentration or the carbon chemical concentration. The substrate concentration index Ic may be the oxygen chemical concentration $Co[cm^{-3}]$ of the semiconductor substrate 10 itself. The substrate concentration index Ic may be the carbon chemical concentration Cc[$cm^{-3}$] of the semiconductor substrate 10 itself.

In step S101, the obtained substrate concentration index Ic is classified into index ranges. The index range is the range of the value of the preset substrate concentration index Ic. The number of the index ranges may be more than one.

In step S102, the acceleration energy of hydrogen ions to form the buffer region 20 is determined. In each index range, the corresponding acceleration energy is predetermined. For each index range, different acceleration energy may be determined. The acceleration energy associated with the index range as which the obtained substrate concentration index Ic is classified is determined as the acceleration energy of the hydrogen ion. The acceleration energy of the hydrogen ion corresponding to the index range may be determined as any value for each index range, or may be determined based on the relational expression between the representative value of the index range and the acceleration energy of the hydrogen ion. The representative value of the index range may be the substrate concentration index Ic that is the center value of the index range, may be the substrate concentration index Ic that is the upper limit value of the index range, or may the substrate concentration index Ic that is the lower limit value of the index range. The acceleration energy of the hydrogen ion may be determined based on the table data indicating the relationship between the substrate concentration index Ic that is the representative value of the index range and the acceleration energy of the hydrogen ion.

In step S104, the hydrogen ion is implanted into the semiconductor substrate 10 with the determined acceleration energy. The step of implanting the hydrogen ion into the semiconductor substrate 10 may have the step of implanting the hydrogen ion from the back surface 23 of the semiconductor substrate 10. If the buffer region 20 has a plurality of peaks, step S100 to step S104 may be performed on two or more peaks.

In step S106, the semiconductor substrate 10 is annealed to form the buffer region 20. Thus, in the manufacturing method of this example, the buffer region 20 of the semiconductor device 100 is formed by implanting the hydrogen ion into the semiconductor substrate 10 with the acceleration energy that depends on the substrate concentration index Ic. In this manner, the buffer region 20 can be formed whose doping concentration is adjusted depending on the oxygen chemical concentration Co or carbon chemical concentration Cc of the semiconductor substrate 10.

Figure 4B:
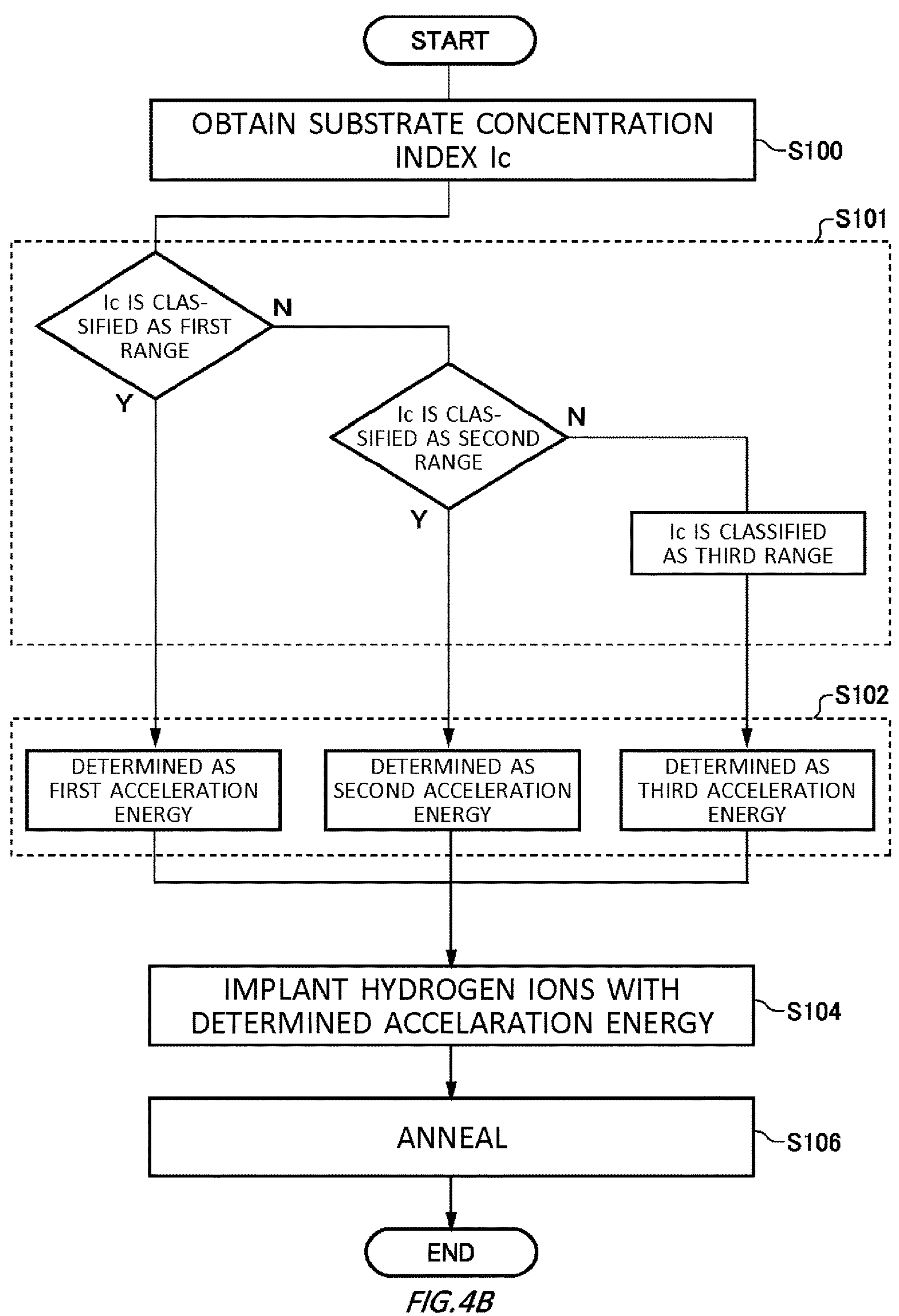
FIG. 4B is a flowchart showing a modification example of the manufacturing method of the semiconductor device 100.

FIG. 4B is a flowchart showing a modification example of the manufacturing method of the semiconductor device 100. The flowchart of this example is different from the example of FIG. 4A in that one or more or a plurality of index ranges into which the obtained substrate concentration index Ic is classified are set and the acceleration energy is set according to each index range, and the substrate concentration index Ic is classified as any of the plurality of index ranges, the acceleration energy is determined according to the classified index range, and the hydrogen ion is implanted into the semiconductor substrate 10 with the determined acceleration energy. In this example, the difference from the example of FIG. 4A is particularly described.

In this example, the substrate concentration index Ic is classified into three index ranges: the first range to the third range, and the acceleration energy is set according to each index range. The number of the index ranges of the substrate concentration index Ic and the index range for each of them is not limited to this example. The number of the index ranges for the substrate concentration index Ic may be one or more, may be more than one, may be more than or equal to three, may be more than or equal to five, or may be more than or equal to ten. The number of index ranges of the substrate concentration index Ic may be less than or equal to 100, may be less than or equal to 50, or may be less than or equal to 20.

In step S100, the substrate concentration index Ic of the semiconductor substrate 10 is obtained.

In step S101, the obtained substrate concentration index Ic is classified into the index range. In other words, it is determined into which the index range from the first range to the third range the obtained substrate concentration index Ic is classified. In this example, three index ranges from the first range to the third range are set but it is not limited thereto. It is examined whether the substrate concentration index Ic is classified as the first range. If the substrate concentration index Ic is classified as the first range, the process proceeds to step S102. If the substrate concentration index Ic is not classified as the first range, it is examined whether the substrate concentration index Ic is classified as the second range. If the substrate concentration index Ic is classified as the second range, the process proceeds to step 102. If the substrate concentration index Ic is not classified as the second range, it is classified as the third range, and the process proceeds to step 102.

In step S102, the acceleration energy that is set to correspond to the index range as which the substrate concentration index Ic obtained in step S100 is classified in step S101 is determined as the acceleration energy of the hydrogen ion. If the classified index range is the first range, the acceleration energy of the hydrogen ion is determined as the first acceleration energy that is set to correspond to the first range. The first range and the first acceleration energy may be the value that is the standard to form the desired buffer region 20.

If the substrate concentration index Ic obtained in step S100 is classified as the second range indicating a higher concentration than the first range in step S101, the acceleration energy of the hydrogen ion is determined as the second acceleration energy that is set to be lower than the first acceleration energy. The substrate concentration index Ic being classified as the second range having a higher concentration than the first range may refer to at least one of the oxygen chemical concentration Co or carbon chemical concentration Cc in the second range having a higher concentration than the first range.

If the substrate concentration index Ic obtained in step S100 is classified as the third range indicating a lower concentration than the first range in step S101, the acceleration energy of the hydrogen ion is determined as the third acceleration energy that is set to be higher than the first acceleration energy. The substrate concentration index Ic being classified as the third range having a lower concentration than the first range may refer to at least one of the oxygen chemical concentration Co or carbon chemical concentration Cc in the third range having a lower concentration than that in the first range.

For example, if the substrate concentration index Ic is represented as $(Co\times[\{Cc/(1E15)\}\times\exp(Co/(1E17))])$ [$cm^{-3}$], the first range may be more than or equal to 2E17 and less than 5E 19. The second range may be more than or equal to 5E19 and less than or equal to 1E22. The third range may be more than or equal to 1E15 and less than 2E17.

For example, if the substrate concentration index Ic is the oxygen chemical concentration Co[$cm^{-3}$] of the semiconductor substrate 10, the first range may be more than or equal to 2.0E17 $cm^{-3}$ and less than 3.0E17 $cm^{-3}$. The second range may be more than or equal to 3.0E17 $cm^{-3}$ and less than or equal to 5.0E17 $cm^{-3}$. The third range may be more than or equal to 1.0E17 $cm^{-3}$ and less than 2.0E17 $cm^{-3}$.

It is noted that, the flowchart of this example may be performed for each of the plurality of peaks to determine the acceleration energy to form each peak. In addition, among the plurality of peaks, only any of the peaks may be determined using the method in this example. For example, the acceleration energy to form the first deepest peak Pd1 may be determined through the method of this example so that the acceleration energy of another peak remains unchanged regardless of the substrate concentration index Ic.

In step S104, the hydrogen ions are implanted into the semiconductor substrate 10 with the acceleration energy determined in step S102.

Figure 4C:
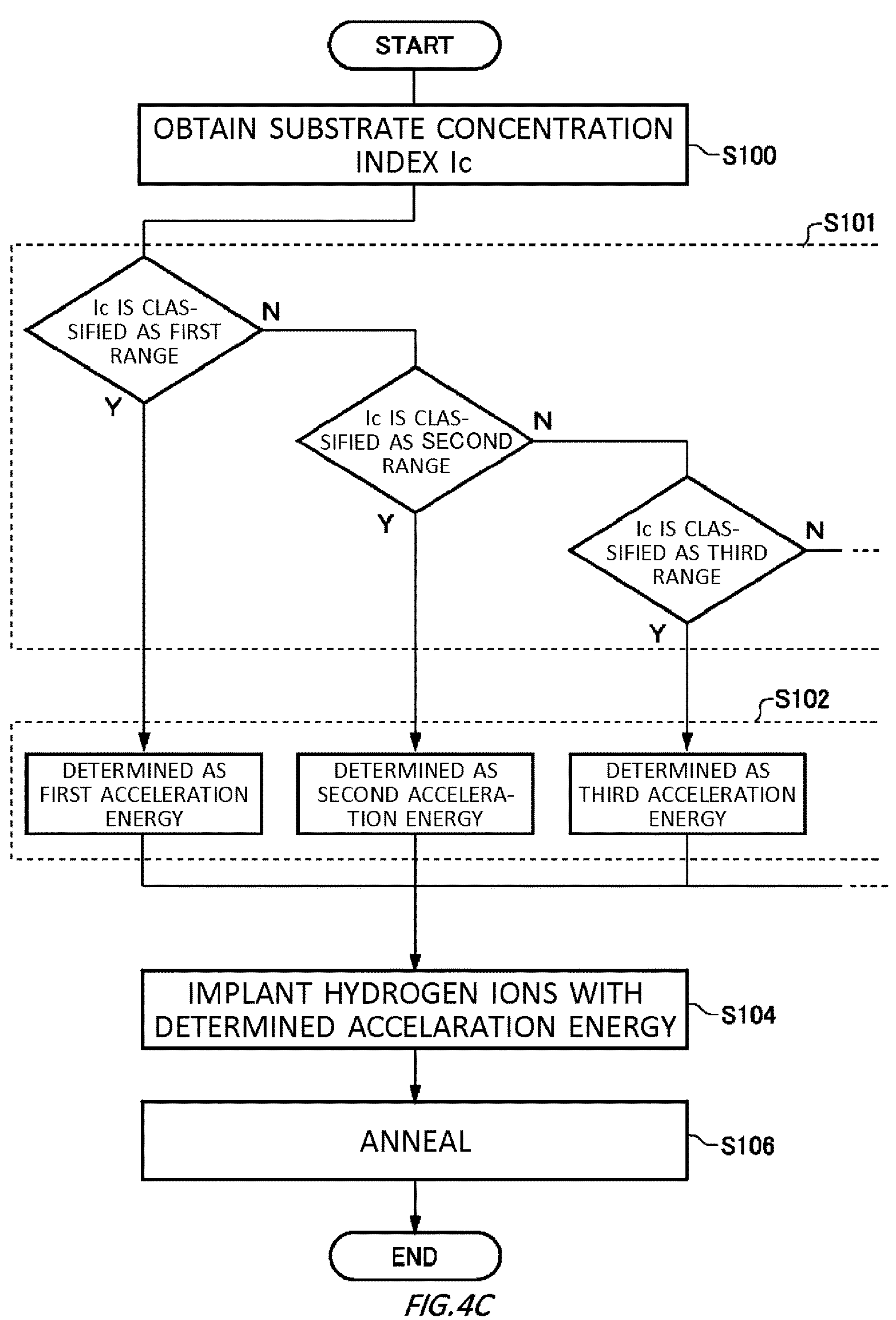
FIG. 4C is a flowchart showing a modification example of the manufacturing method of the semiconductor device 100.

FIG. 4C is a flowchart showing a modification example of a manufacturing method of the semiconductor device 100. The flowchart in this example is different from the example in FIG. 4B in that it has three more index ranges. In this example, the difference from the example of FIG. 4B is particularly described.

In step S101, it is determined as which index range after the obtained first range the substrate concentration index Ic is classified. It is examined whether the substrate concentration index Ic is classified as the first range. If the substrate concentration index Ic is classified as the first range, the process proceeds to step S102. If the substrate concentration index Ic is not classified as the first range, it is examined whether the substrate concentration index Ic is classified as the second range. If the substrate concentration index Ic is classified as the second range, the process proceeds to step 102. If the substrate concentration index Ic is not classified as the second range, whether it is classified as the fourth range (not shown) is further examined, and if being classified so, the process proceeds to step 102, or if not being classified as the fourth range either, whether it is classified as the fifth range (not shown) is further examined, and so on. These operations are repeated for ranges toward the final index range until the classification completes.

In step S102, the acceleration energy that is set to correspond to the index range as which the substrate concentration index Ic obtained in step S100 is classified in step S101 is determined as the acceleration energy of the hydrogen ion. The representative value from the first range to the final index range may increase or may decrease from the first range to the final index range.

The manufacturing method of this example can reduce the variation of the oxygen chemical concentration Co and the carbon chemical concentration Cc in the buffer region 20 for each semiconductor substrate 10. In other words, even if the semiconductor device 100 is manufactured by using a different semiconductor substrate 10, the semiconductor device 100 with a high reliability can be provided with the constant characteristics of the buffer region 20. Because the semiconductor device 100 can reduce the variation in the buffer region 20, the breakdown voltage can be easily set to any range.

It is noted that the acceleration energy when manufacturing semiconductor device 100 can be detected by analyzing the distribution of hydrogen or the like in the buffer region 20 through SIMS or the like. In addition, the substrate concentration index Ic of the semiconductor substrate 10 can be detected by analyzing the oxygen and carbon in the drift region 18 through SIMS or the like.

Figure 5A:
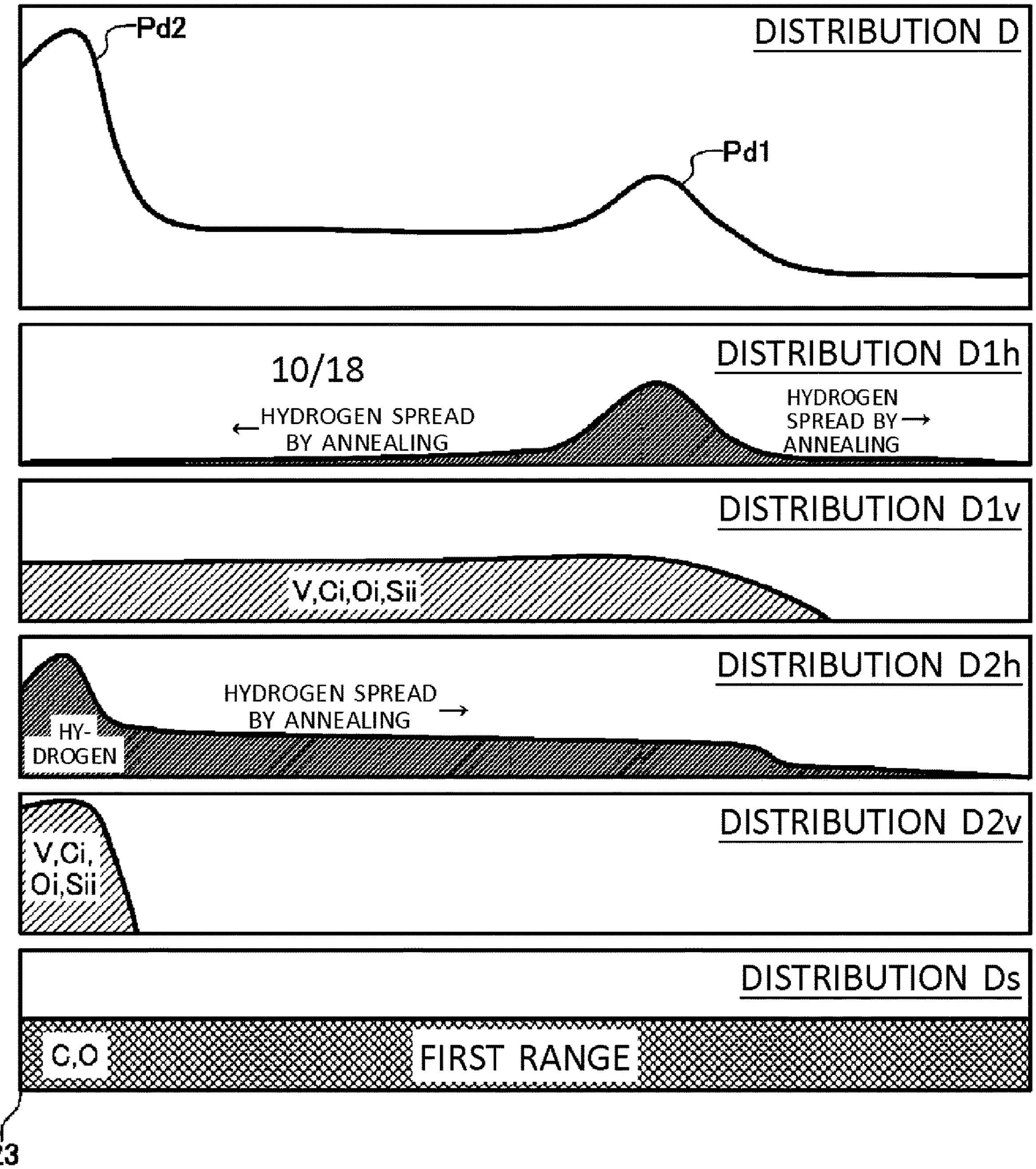
FIG. 5A shows a distribution of hydrogen ions and the like in a buffer region 20.

FIG. 5A shows the distribution of hydrogen chemical concentration or the like in the buffer region 20. In this example, the case is described where the semiconductor substrate 10 is used whose substrate concentration index Ic is the first range.

The distribution D is the concentration distribution of the hydrogen donor in the case where the semiconductor substrate 10 is annealed after the ion implantation with the first deepest peak Pd1 and the second deepest peak Pd2. Although in this example the principle is described using the first deepest peak Pd1 and the second deepest peak Pd2, the similar principle may be also applied to other peaks of the buffer region 20.

The distribution D1*h* is the distribution of the hydrogen chemical concentration that is implanted to form the first deepest peak Pd1. The hydrogen implanted to form the first deepest peak Pd1 diffuses through annealing. In the graph whose horizontal axis is in the depth direction of the semiconductor substrate 10, the hydrogen of the first deepest peak Pd1 diffuses toward each of the front surface 21 and the back surface 23.

The distribution D1*v* is the concentration distribution of the lattice defect and the interstitial element generated in response to the hydrogen ions being implanted to form the first deepest peak Pd1. V refers to the density of vacancy generated in the semiconductor substrate 10 due to the implantation of the hydrogen ions. The suffix i of the Ci, Oi, and Sii indicates that these are the interstitial elements of the semiconductor substrate 10. Ci is an interstitial carbon, Oi is an interstitial oxygen, and Sii is an interstitial silicon.

The distribution D2*h* is the distribution of the hydrogen chemical concentration implanted to form the second deepest peak Pd2. Similarly, for the second deepest peak Pd2, the hydrogen of the second deepest peak Pd2 diffuses toward each of the front surface 21 and the back surface 23. If the hydrogen chemical concentration of the second deepest peak Pd2 is higher than the hydrogen chemical concentration of the first deepest peak Pd1, the hydrogen chemical concentration that diffuses from the second deepest peak Pd2 may be higher than the chemical concentration of hydrogen that diffuses from the first deepest peak Pd1.

The distribution D2*v* is the distribution of the lattice defect and interstitial element generated in response to the hydrogen ion being implanted to form the second deepest peak Pd2. If the hydrogen chemical concentration of the second deepest peak Pd2 is higher than the hydrogen chemical concentration of the first deepest peak Pd1, the peak concentration of the distribution D2*v* may be higher than the peak concentration of the distribution D1*v*. However, the distribution D2*v* is formed on the side of the implantation of the hydrogen ion more shallowly than the distribution D1*v*.

The distribution Ds shows the distribution of the oxygen chemical concentration Co and the carbon chemical concentration Cc before the doping region is formed in the semiconductor substrate 10. The distribution Ds may be a relatively uniform concentration distribution in the semiconductor substrate 10. The concentration distribution being relatively uniform may refer to the concentration variation with reference to the average concentration of the region from 50% to 75% between the front surface 21 and the back surface 23 of the semiconductor substrate 10 being more than or equal to 50% and less than or equal to 200% over the region, as an example. The oxygen chemical concentration Co and the carbon chemical concentration Cc of the distribution Ds may be the same as the oxygen chemical concentration and the carbon chemical concentration of the drift region 18. The oxygen chemical concentration Co of the semiconductor substrate 10 may be more than or equal to 1E17 $cm^{-3}$ and less than or equal to 1E18 $cm^{-3}$. The carbon chemical concentration Cc of the semiconductor substrate 10 may be more than or equal to 0.05E16 $cm^{-3}$ and less than or equal to 2.6E16 $cm^{-3}$.

Herein, when the hydrogen ions pass through the semiconductor substrate 10, they collide with atoms of the semiconductor (silicon in this example) and damage the crystal lattice, forming the lattice defect in the region (passed-through region) shallower than the range Rp of the hydrogen ions. The lattice defect formed in the passed-through region is the vacancy-type lattice defect mainly comprised of vacancy, such as single atom vacancy (V), multiple atom vacancy (VV), and the like.

When annealing is performed after implanting the hydrogen ions into the semiconductor substrate 10, the hydrogen donors are formed in the passed-through region of the hydrogen ion and the N type layer with a higher doping concentration than that of the drift region 18 is formed. The concentration of the hydrogen donors is determined depending on the total amount of a plurality of factors such as the hydrogen chemical concentration, the oxygen chemical concentration, the carbon chemical concentration, the lattice defect concentration, and the like. For example, in the buffer region 20, due to the effect of Ci, Oi, Sii, or the like existing in the interstice of the semiconductor substrate 10, hydrogen donors such as CiOi-H, $VO_2H$, or Sii-H are generated. Therefore, when the oxygen chemical concentration Co and the carbon chemical concentration Cc included in the semiconductor substrate 10 are higher, the hydrogen donors easily occur. On the other hand, when the oxygen chemical concentration Co and the carbon chemical concentration Cc of the semiconductor substrate 10 vary, the concentration of Ci and Oi also varies, causing the concentration of the hydrogen donors to vary. When the variation of the doping concentration of the buffer region 20 occurs, the characteristics variation of the breakdown voltage or the like of the semiconductor device 100 may occur.

In the semiconductor device 100, the acceleration energy is adjusted according to the substrate concentration index Ic of the semiconductor substrate 10 to control the depth of the region through which the hydrogen ions pass, so that the doping concentration of the buffer region 20 can be adjusted. For example, the acceleration energy is increased to widen the passed-through region of the hydrogen ion, resulting in the increase in the amount of defect formed in the semiconductor substrate 10. The acceleration energy is reduced to narrow the passed-through region of the hydrogen ion, resulting in the decrease in the amount of the defect formed in the semiconductor substrate 10. In this manner, the magnitude of the acceleration energy is adjusted according to the substrate concentration index Ic to control the concentration of the hydrogen donor, so that the characteristics variation of the semiconductor device 100 can be reduced.

In an example, the first deepest peak Pd1 may affect the vibration of waveform at the time of switching of the semiconductor device 100. The switching characteristics of the semiconductor device 100 can be stabilized by adjusting the acceleration energy of the first deepest peak Pd1 in consideration of the substrate concentration index Ic. In addition, the peak on the side closer to the back surface 23 of the buffer region 20 may affect the implantation of the hole from the collector region 22. The implantation efficiency of the hole from the collector region 22 can be stabilized by adjusting the acceleration energy of the buffer region 20 in consideration of the substrate concentration index Ic.

Figure 5B:
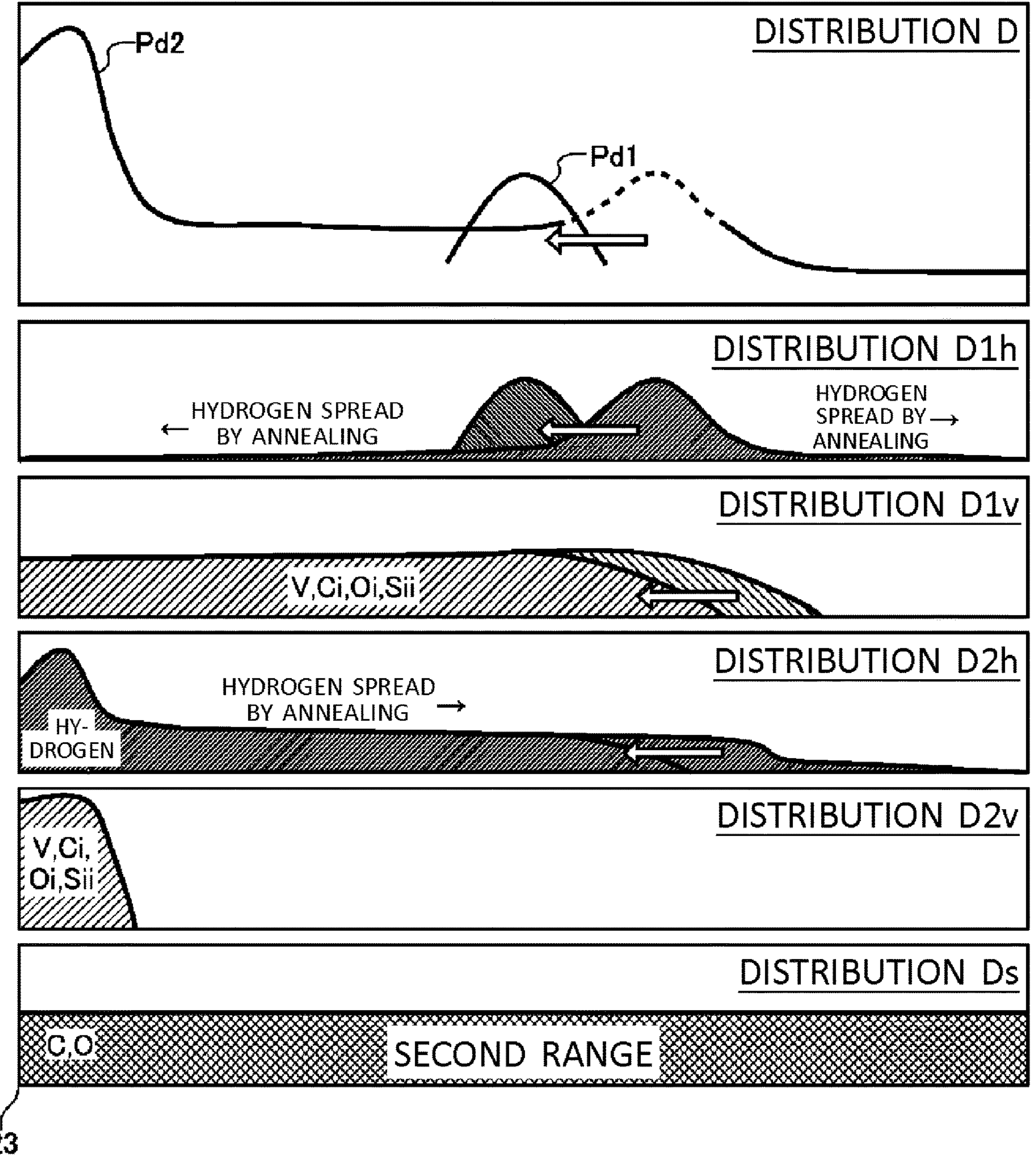
FIG. 5B shows a distribution of hydrogen ions and the like in the buffer region 20.

FIG. 5B shows the distribution of the hydrogen chemical concentration or the like in the buffer region 20. In this example, the case is described where the semiconductor substrate 10 is used whose substrate concentration index Ic is the second range with a higher concentration than the first range.

If the substrate concentration index Ic indicates a relatively higher concentration, at least one of the oxygen chemical concentration Co or the carbon chemical concentration Cc existing in the semiconductor substrate 10 is high. Therefore, when the first deepest peak Pd1 is formed by implanting the hydrogen ion in the same condition as the case where the substrate concentration index Ic is the first range, the concentration of hydrogen donor may be higher than in the case of the first range. Therefore, the first deepest peak Pd1 can be implanted shallowly with the second acceleration energy of the first deepest peak Pd1 being lower than the first acceleration energy corresponding to the first range.

When the first deepest peak Pd1 is shallowly implanted, the passed-through region of the hydrogen ion from the back surface 23 is reduced and the total amount of the distribution D1$v$ decreases. This can reduce the variation of the characteristics of the semiconductor device 100 manufactured with the first acceleration energy with the substrate concentration index Ic being in the first range and the semiconductor device 100 manufactured with the second acceleration energy with the substrate concentration index Ic being in the second range.

Figure 5C:
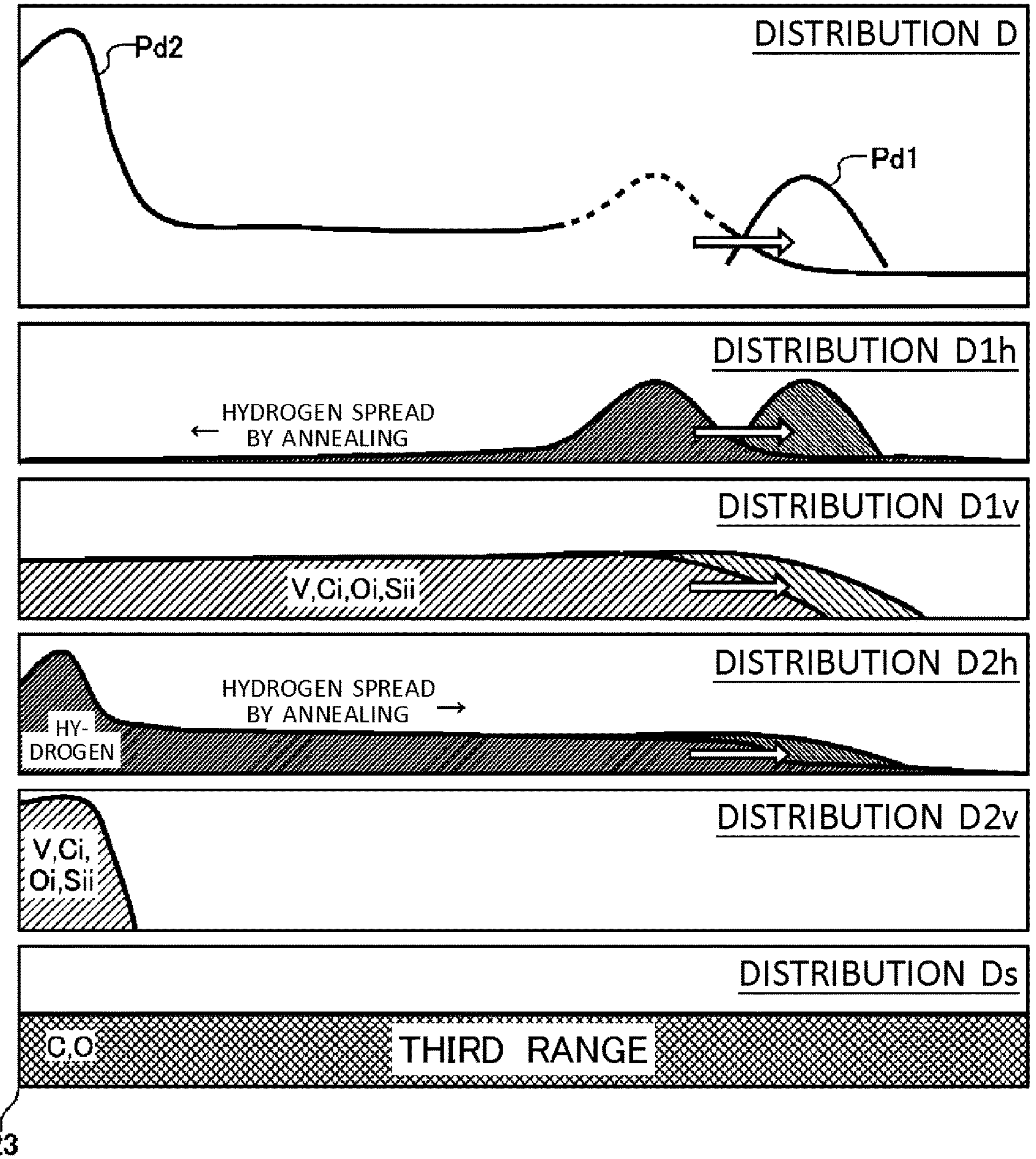
FIG. 5C shows a distribution of hydrogen ions and the like in the buffer region 20.

FIG. 5C shows the distribution of the hydrogen ion or the like in the buffer region 20. In this example, the case is described where the semiconductor substrate 10 is used whose substrate concentration index Ic is the third range with a lower concentration than the first range.

If the substrate concentration index Ic indicates a relatively lower concentration, at least one of the oxygen chemical concentration Co or the carbon chemical concentration Cc existing in the semiconductor substrate 10 is low. Therefore, when the first deepest peak Pd1 is formed by implanting the hydrogen ion in the same condition as the case where the substrate concentration index Ic is the first range, the concentration of hydrogen donor may be lower than in the case of the first range. Therefore, the first deepest peak Pd1 can be deeply implanted with the third acceleration energy of the first deepest peak Pd1 being higher than the first acceleration energy corresponding to the first range.

When the first deepest peak Pd1 is deeply implanted, the passed-through region of the hydrogen ion from the back surface 23 is enlarged and the total amount of the distribution D1$v$ increases. This can reduce the variation of the characteristics of the semiconductor device 100 manufactured with the first acceleration energy with the substrate concentration index Ic being in the first range and the semiconductor device 100 manufactured with the third acceleration energy with the substrate concentration index Ic being in the third range.

Figure 6:
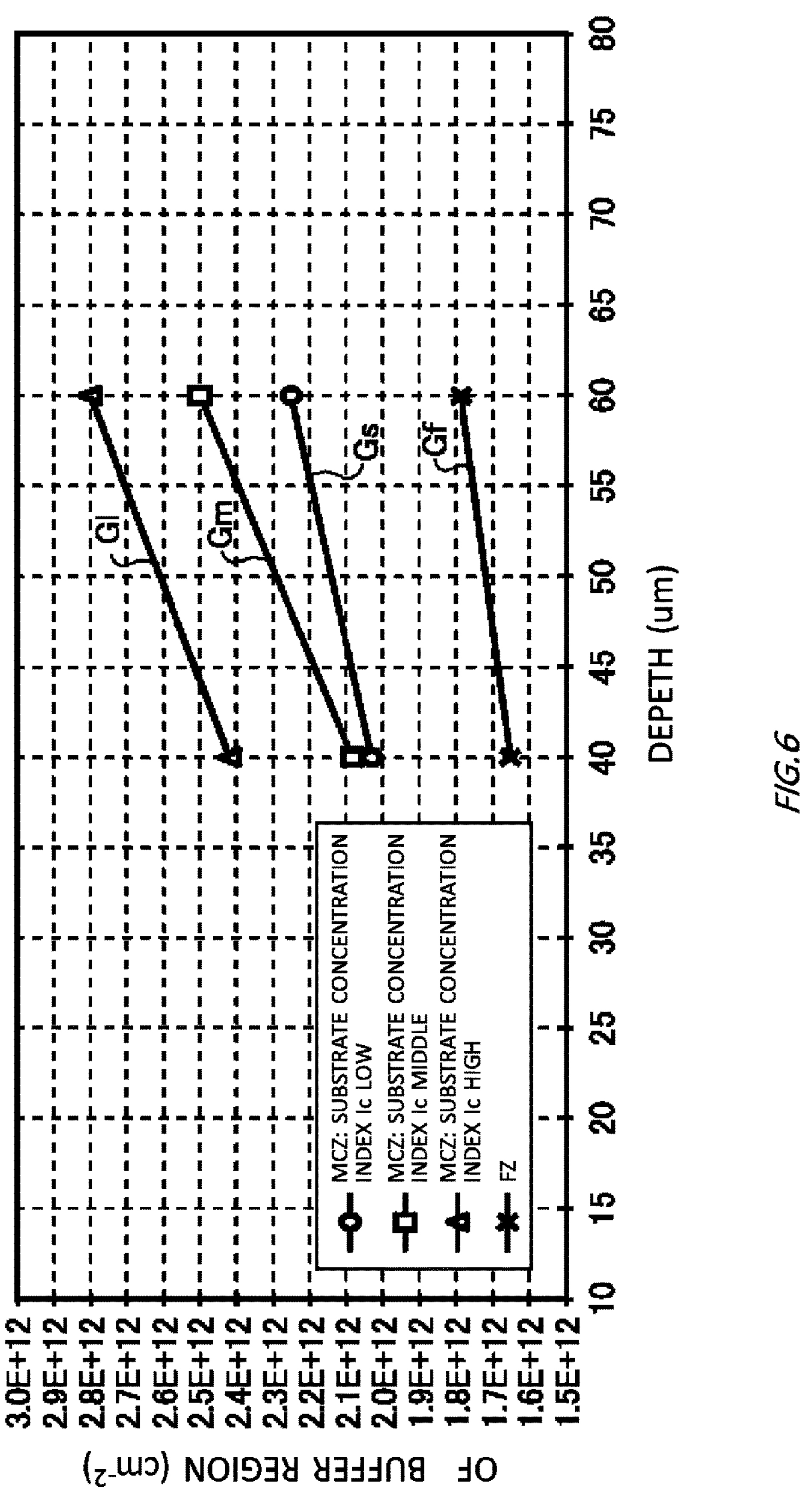
FIG. 6 shows a relationship between a depth of a peak and an integrated concentration of the buffer region 20.

FIG. 6 shows the relationship between the depth of the peak and the integrated concentration of the buffer region 20. In this figure, the relationships between the depth of the peak and the integrated concentration of the buffer region 20 are compared for four different types of the semiconductor substrate 10. In this example, the integrated concentration is shown in the case where the peak of the buffer region 20 is formed at the depth position that is 40 μm and 60 μm from the back surface 23.

The graph Gm is the data in the case where the semiconductor substrate 10 is the MCZ substrate and the substrate concentration index Ic is the first range. If the substrate concentration index Ic is the first range, the integrated concentration of the buffer region 20 may be more than or equal to $2.1\times10^{12}/cm^2$ and less than or equal to $2.5\times10^{12}$ $cm^2$.

The graph Gl is the data in the case where the semiconductor substrate 10 is the MCZ substrate and the substrate concentration index Ic is the second range. In other words, the substrate concentration index Ic in the graph Gl is higher than the substrate concentration index Ic in the graph Gm. If the substrate concentration index Ic is the second range, the integrated concentration of the buffer region 20 may be more than or equal to $2.4\times10^{12}/cm^2$ cm and less than or equal to $2.8\times10^{12}$ $cm^2$.

The graph Gs is the data in the case where the semiconductor substrate 10 is the MCZ substrate and the substrate concentration index Ic is the third range. In other words, the substrate concentration index Ic in the graph Gs is lower than the substrate concentration index Ic in the graph Gm. If the substrate concentration index Ic is the third range, the integrated concentration of the buffer region 20 may be more than or equal to $2.0\times10^{12}/cm^2$ and less than or equal to $2.25\times10^{12}/cm^2$.

The graph Gf is the data in the case where the semiconductor substrate 10 is the FZ substrate. The FZ substrate has a lower oxygen chemical concentration Co and carbon chemical concentration Cc of the semiconductor substrate 10 than the MCZ substrate, resulting in a lower substrate concentration index Ic. If the semiconductor substrate 10 is the FZ substrate, the integrated concentration of the buffer region 20 may be more than or equal to $1.65\times10^{12}/cm^2$ and less than or equal to $1.8\times10^{12}/cm^2$. Furthermore, the integrated concentration of the buffer region 20 may be more than or equal to $1.65\times10^{12}/cm^2$ and less than or equal to $2.8\times10^{12}/cm^2$ and may be more than or equal to $2.0\times10^{12}/cm^2$ and less than or equal to $2.8\times10^{12}/cm^2$.

In either example, the integrated concentration of the buffer region 20 is increased by increasing the acceleration energy and making the depth position of the peak deeper. In addition, because the hydrogen donor of the semiconductor substrate 10 with a higher substrate concentration index Ic is more easily formed, the integrated concentration of the buffer region 20 increases. In this manner, the acceleration energy to form the buffer region 20 may be determined based on the substrate concentration index Ic obtained for each of different types of the semiconductor substrate 10.

Figure 7:
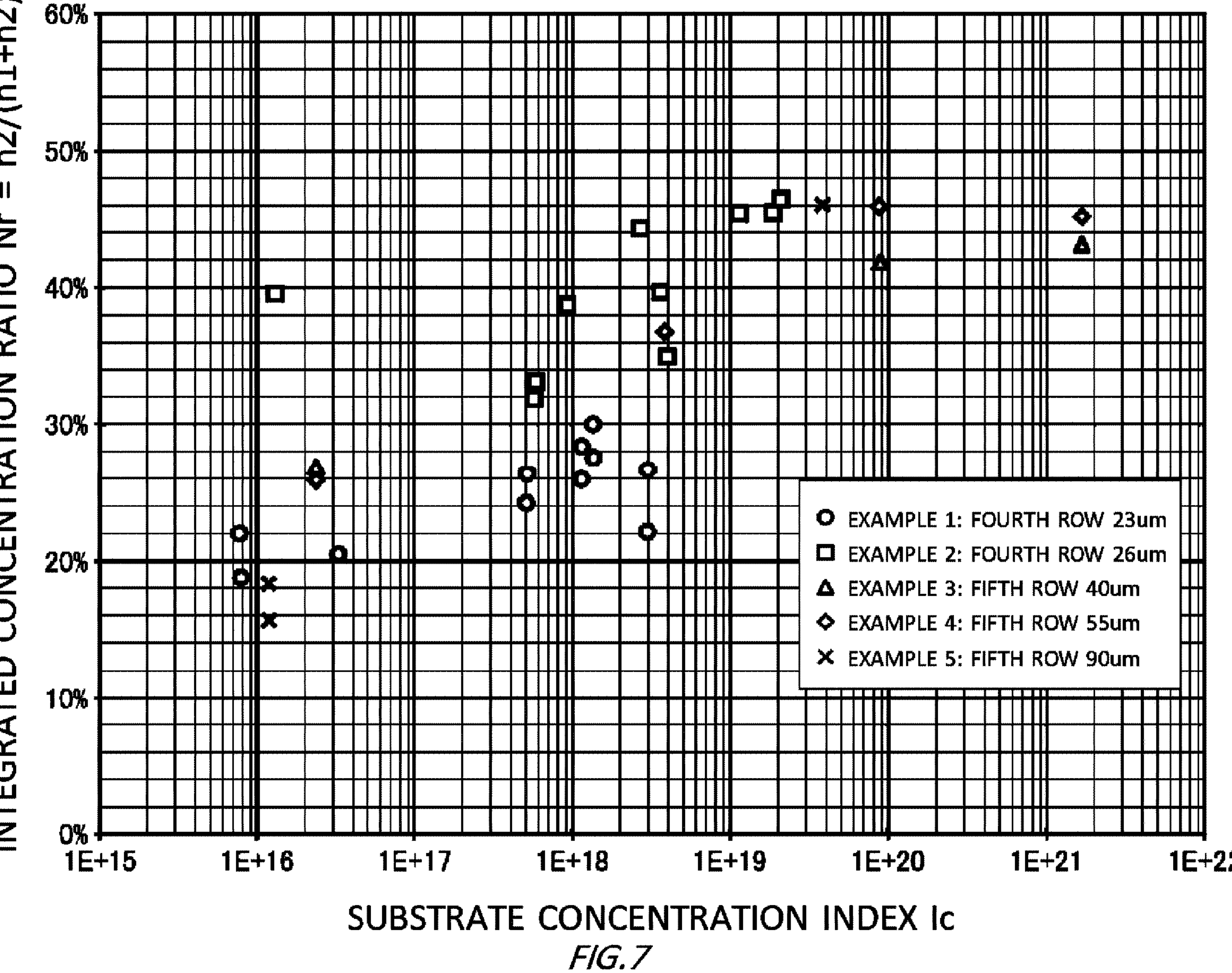
FIG. 7 shows a relationship between a substrate concentration index Ic and an integrated concentration ratio Nr.

FIG. 7 shows the relationship between the substrate concentration index Ic and the integrated concentration ratio Nr. In this figure, the substrate concentration index Ic according to the semiconductor substrate 10 and the integrated concentration ratio Nr of the buffer region 20 formed according to the substrate concentration index Ic are plotted. The graph of this figure is a semi-log graph, in which the vertical axis is the integrated concentration ratio Nr=(n2/(n1+n2)) in the linear scale and the horizontal axis is the substrate concentration index (Co×[{Cc/(1E15)}×exp(Co/(1E17))])[/$cm^3$] in the log scale. One data point indicates the association between the substrate concentration index Ic and the integrated concentration ratio Nr in one semiconductor device. It is noted that one data point may be the average value for a plurality of semiconductor devices that are obtained by dividing one semiconductor substrate through dicing or the like.

The substrate concentration index Ic is the index for which the effect of the oxygen chemical concentration Co and the effect of the carbon chemical concentration Cc on the generation of the hydrogen donor is taken into consideration. The oxygen chemical concentration Co is supposed to contribute to the concentration of the hydrogen donor generated in the passed-through region of the hydrogen donor. For further taking the effect of the carbon chemical concentration Cc into consideration, the oxygen chemical concentration Co is multiplied by a correction factor. The correction factor means the effect of the carbon chemical concentration Cc on the generation of the hydrogen donor. Furthermore, for the correction factor, a model is assumed where the effect of the carbon chemical concentration Cc depends on the oxygen chemical concentration Co. In other words, the carbon chemical concentration Cc normalized with the predetermined carbon chemical concentration (herein, 1E15/$cm^3$) is multiplied by the value determined by an exponential function of the oxygen chemical concentration Co normalized with the predetermined oxygen chemical concentration (herein, 1E17/$cm^3$). With the model, the integrated concentration ratio Nr linearly plotted with the log of the substrate concentration index Ic is shown with a relatively linear manner.

Example 1 shows an example where the first deepest peak Pd1 is 23 μm when the buffer region 20 has four peaks. Example 2 shows an example where the first deepest peak Pd1 is 26 μm when the buffer region 20 has four peaks. Example 3 shows an example where the first deepest peak Pd1 is 40 μm when the buffer region 20 has five peaks. Example 4 shows an example where the first deepest peak Pd1 is 55 μm when the buffer region 20 has five peaks. Example 5 shows an example where the first deepest peak Pd1 is 90 μm when the buffer region 20 has five peaks.

Figure 8:
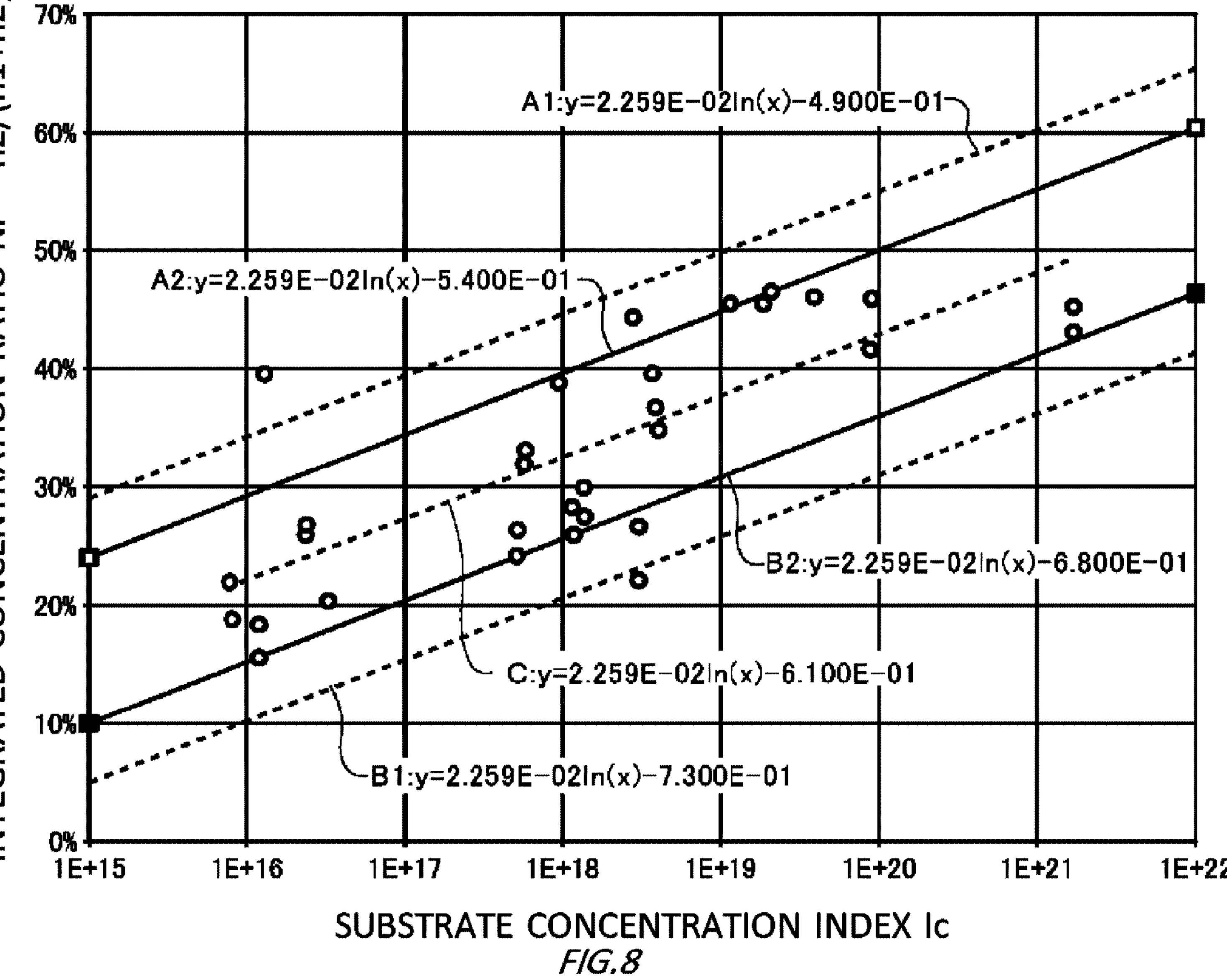
FIG. 8 shows a relationship between a substrate concentration index Ic and an integrated concentration ratio Nr.

FIG. 8 shows the relationship between the substrate concentration index Ic and the integrated concentration ratio Nr. In this figure, an arbitrary upper limit line and lower limit line are added to the distribution shown in FIG. 7.

The semiconductor substrate 10 may have an oxygen chemical concentration Co and a carbon chemical concentration Cc such that the substrate concentration index Ic is in a range more than or equal to 1E15 and less than or equal to 1E22. The fitting formula indicating the relationship between the integrated concentration ratio Nr and the substrate concentration index Ic in this example is represented as the following formula: fitting line C: y=2.259E−02×ln(x)−6.100E−01, wherein y is the integrated concentration ratio Nr and x is the substrate concentration index Ic of this example.

The buffer region 20 may have a plurality of peaks such that the integrated concentration ratio Nr falls within the range between arbitrary upper limit line and lower limit line. The integrated concentration ratio Nr of this example may be in a range between a upper limit line A1 and a lower limit line B1 represented as the following formula using the slope of the fitting line C:

Upper limit line $A1$: $y$=2.259E−02×ln($x$)−4.900E−01

Lower limit line $B1$: $y$=2.259E−02×ln($x$)−7.300E−01

Also, the integrated concentration ratio Nr may be in the range between an upper limit line A2 and a lower limit line B2 represented as the following formula.

Upper limit line $A2$: $y$=2.259E−02×ln($x$)−5.400E−01

Lower limit line $B2$: $y$=2.259E−02×ln($x$)−6.800E−01

When the integrated concentration ratio Nr is above the upper limit line, it can be controlled such that it falls within the range between the upper limit line and the lower limit line, by reducing the acceleration energy of the buffer region 20 to reduce the integrated concentration ratio Nr. On the other hand, when the integrated concentration ratio Nr is below the lower limit line, it can be controlled such that it falls within the range between the upper limit line and the lower limit line, by increasing the acceleration energy of the buffer region 20 to increase the integrated concentration ratio Nr. In this manner, the characteristics variation of the semiconductor device 100 can be reduced according to the substrate concentration index Ic by adjusting the acceleration energy of the buffer region 20 such that the integrated concentration ratio Nr falls within the predetermine range.

Figure 9:
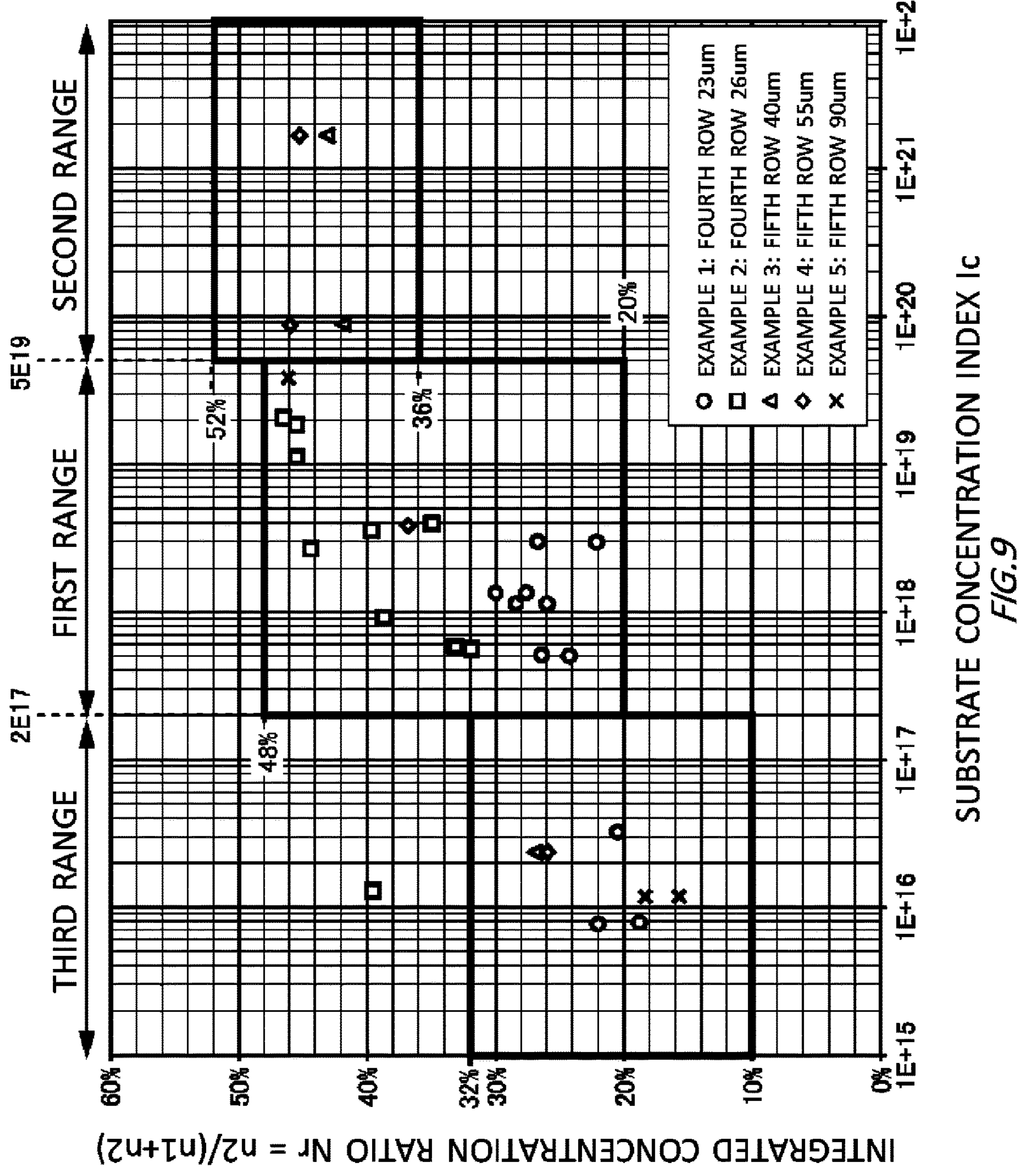
FIG. 9 shows a relationship between a substrate concentration index Ic and an integrated concentration ratio Nr.

FIG. 9 shows the relationship between the substrate concentration index Ic and the integrated concentration ratio Nr. In this example, the distribution shown in FIG. 7 is classified into three regions from the first range to the third range. The substrate concentration index Ic of this example is defined as $(Co\times[\{Cc/(1E15)\}\times\exp(Co/(1E17))])[cm^{-3}]$.

The substrate concentration index Ic of the first range may be more than or equal to $2E17/cm^3$ and less than $5E19/cm^3$. In other words, the semiconductor substrate 10 may have the oxygen chemical concentration Co and carbon chemical concentration Cc such that the substrate concentration index Ic is in the range more than or equal to $2E17/cm^3$ and less than $5E19/cm^3$. In this case, the first acceleration energy may be determined such that the integrated concentration ratio Nr is more than or equal to 20% and less than or equal to 48%.

The substrate concentration index Ic of the second range may be more than or equal to $5E19/cm^3$ and less than $1E22/cm^3$. In other words, the semiconductor substrate 10 may have the oxygen chemical concentration Co and carbon chemical concentration Cc such that the substrate concentration index Ic is in the range more than or equal to $5E19/cm^3$ and less than $1E22/cm^3$. In this case, the second acceleration energy may be determined such that the integrated concentration ratio Nr is more than or equal to 36% and less than or equal to 52%.

The substrate concentration index Ic of the third range may be more than or equal to $1E15/cm^3$ and less than or equal to $2E17/cm^3$. In other words, the semiconductor substrate 10 may have the oxygen chemical concentration Co and carbon chemical concentration Cc such that the substrate concentration index Ic is in the range more than or equal to $1E15/cm^3$ and less than $2E17/cm^3$. In this case, the third acceleration energy may be determined such that the integrated concentration ratio Nr is more than or equal to 10% and less than or equal to 32%.

Figure 10A:
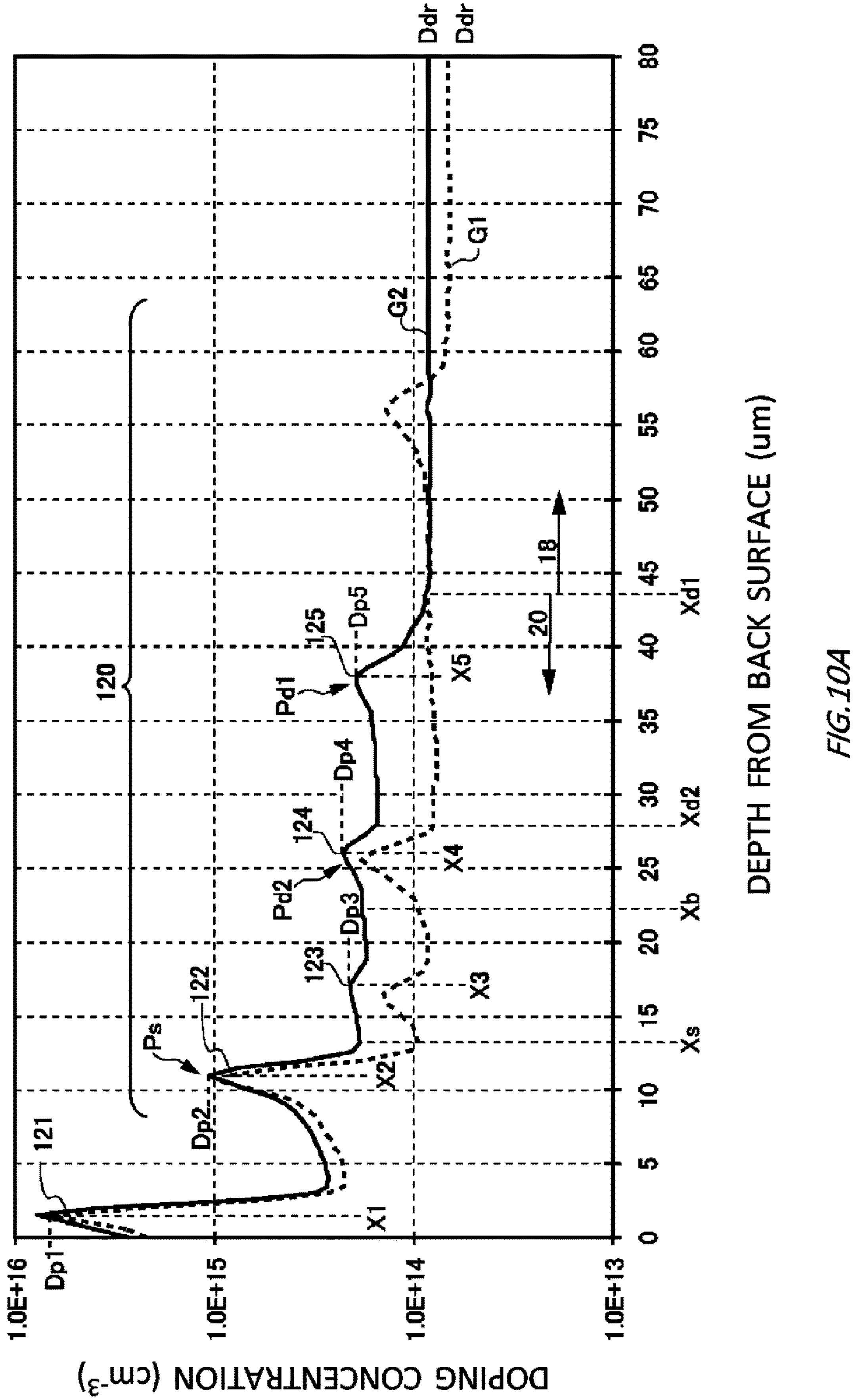
FIG. 10A shows a modification example of a doping concentration distribution of the buffer region 20.

FIG. 10A shows a modification example of the doping concentration distribution of the buffer region 20. The graph G2 is an example of the doping concentration distribution of the buffer region 20 having five peaks. In this figure, G1 of FIG. 3 is depicted with the dash line to be superimposed. In the graph G2, the relational expression of the depth position may be also met as in the graph G1. In other words, Xd1 and Xd2 may meet $1<Xd1/Xd2<10$, and may meet $1.2<Xd1/Xd2<5$. In this example, the difference from the graph G1 is particularly described.

The graph G2 shows the distribution in the case where the semiconductor substrate 10 showing the substrate concentration index Ic with a higher concentration than that of the graph G1 is used. The first deepest peak Pd1 of the graph G2 is formed with lower acceleration energy than that of the first deepest peak Pd1 of the graph G1. The acceleration energy to form peaks other than the first deepest peak Pd1 may be the same in the graph G1 and the graph G2.

The fifth peak 125 of this example may be provided at a position closer to the back surface 23 than the fifth peak 125 of the graph G1. The depth position X5 may be more than or equal to 30 μm and may be less than or equal to 40 μm. The doping concentration of the first deepest peak Pd1 (that is, the doping concentration Dp5 of the fifth peak 125) may be lower than the doping concentration of the second deepest peak Pd2 (that is, the doping concentration Dp4 of the fourth peak 124).

Figure 10B:
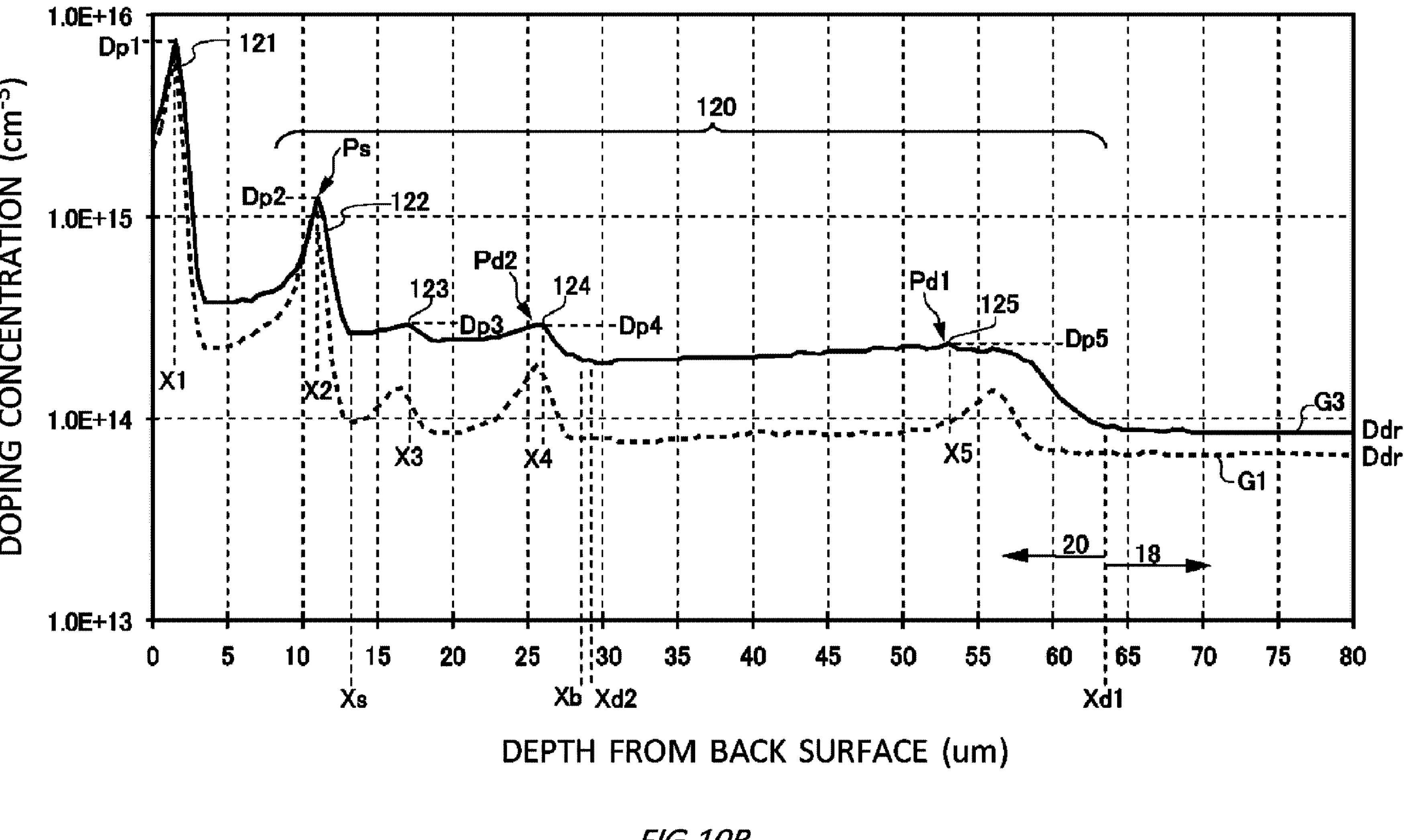
FIG. 10B shows a modification example of a doping concentration distribution of the buffer region 20.

FIG. 10B shows a modification example of the doping concentration distribution of the buffer region 20. The graph G3 is an example of the doping concentration distribution of the buffer region 20 having five peaks. In this figure, G1 of FIG. 3 is depicted with the dash line to be superimposed.

The graph G3 shows the distribution in the case where the semiconductor substrate 10 showing the substrate concentration index Ic with a higher concentration than that of the graph G1 and graph G2 is used. The first deepest peak Pd1 of the graph G3 is formed with lower acceleration energy than that of the first deepest peak Pd1 of the graph G1. The acceleration energy to form peaks other than the first deepest peak Pd1 may be the same in the graph G1 and the graph G3.

The fifth peak 125 of this example may be a peak that is more flat in comparison with other peaks without a clear peak being formed. In this case, the doping concentration Dp5 of the fifth peak 125 may be the highest doping concentration between Xd2 and the drift region 18. Xd1 may be at a position such that it is a substrate concentration of the drift region 18 in the end portion on the side of the front surface of the fifth peak 125.

While the present invention has been described by way of the embodiments, the technical scope of the present invention is not limited to the above described embodiments. It is apparent to persons skilled in the art that various alterations or improvements can be made to the above described embodiments. It is also apparent from the description of the claims that the embodiments to which such alterations or improvements are made can be included in the technical scope of the present invention.

The operations, procedures, steps, stages, etc. of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10 semiconductor substrate
12 emitter region
14 base region
15 contact region
16 accumulation region
17 well region
18 drift region
20 buffer region
21 front surface
22 collector region
23 back surface
24 collector electrode
25 connection portion
30 dummy trench portion
31 extending portion
32 dummy dielectric film
33 connection portion
34 dummy conductive portion
38 interlayer dielectric film

40 gate trench portion
41 extending portion
42 gate dielectric film
43 connection portion
44 gate conductive portion
50 gate metal layer
52 emitter electrode
54 contact hole
55 contact hole
56 contact hole
70 transistor portion
71 mesa portion
80 diode portion
81 mesa portion
82 cathode region
85 extension region
90 boundary region
91 mesa portion
100 semiconductor device
105 end side
112 gate pad
121 first peak
122 second peak
123 third peak
124 fourth peak
125 fifth peak
120 peak group
130 outer circumferential gate runner
131 active-side gate runner
140 edge termination structure portion
151 first lifetime control region
152 second lifetime control region
160 active portion

What is claimed is:

1. A manufacturing method of a semiconductor device including a buffer region in a semiconductor substrate, comprising:

obtaining a substrate concentration index related to at least one of an oxygen chemical concentration or a carbon chemical concentration included in the semiconductor substrate;

classifying the substrate concentration index as any index range among a predetermined plurality of index ranges;

determining an acceleration energy of hydrogen ions to be implanted into the semiconductor substrate to an acceleration energy that is preset to correspond to the index range as which the substrate concentration index is classified; and forming a buffer region of the semiconductor device by implanting hydrogen ions into the semiconductor substrate with the determined acceleration energy.

2. The manufacturing method of a semiconductor device according to claim 1, wherein a number of the plurality of index ranges is more than or equal to three.

3. The manufacturing method of a semiconductor device according to claim 2, wherein if the index range as which the substrate concentration index is classified is a first range that is one of the index ranges, the acceleration energy is determined to be a first acceleration energy that is set to correspond to the first range;

if the index range as which the substrate concentration index is classified is a second range that is an index range indicating a higher concentration than the first range, the acceleration energy is determined to be a second acceleration energy that is set to be lower than the first acceleration energy; and if the index range as which the substrate concentration index is classified is a third range that is an index range indicating a lower concentration than the first range, the acceleration energy is determined to be a third acceleration energy that is set to be higher than the first acceleration energy.

4. The manufacturing method of a semiconductor device according to claim 1, wherein the substrate concentration index is defined as $(Co\times[\{Cc/(1E15)\}\times\exp(Co/(1E17))])$ [$cm^{-3}$], wherein Co[$cm^{-3}$] is an oxygen chemical concentration of the semiconductor substrate and Cc[$cm^{-3}$] is a carbon chemical concentration of the semiconductor substrate.

5. The manufacturing method of a semiconductor device according to claim 3, wherein the first range is more than or equal to 2E17 [$cm^{-3}$] and less than 5E19 [$cm^{-3}$].

6. The manufacturing method of a semiconductor device according to claim 3, wherein the second range is more than or equal to 5E19 [$cm^{-3}$] and less than or equal to 1E22 [$cm^{-3}$].

7. The manufacturing method of a semiconductor device according to claim 3, wherein the third range is more than or equal to 1E15 [$cm^{-3}$] and less than 2E17 [$cm^{-3}$].

8. The manufacturing method of a semiconductor device according to claim 1, wherein the substrate concentration index is an oxygen chemical concentration Co[$cm^{-3}$] of the semiconductor substrate.

9. The manufacturing method of a semiconductor device according to claim 3, wherein the first range is more than or equal to 2.0E17 [$cm^{-3}$] and less than 3.0E17 [$cm^{-3}$].

10. The manufacturing method of a semiconductor device according to claim 3, wherein the second range is more than or equal to 3.0E17 [$cm^{-3}$] and less than or equal to 5.0E17 [$cm^{-3}$].

11. The manufacturing method of a semiconductor device according to claim 3, wherein the third range is more than or equal to 1.0E17 [$cm^{-3}$] and less than 2.0E17 [$cm^{-3}$].

12. The manufacturing method of a semiconductor device according to claim 1, wherein implanting hydrogen ions into the semiconductor substrate includes the implanting hydrogen ions from a back surface of the semiconductor substrate.

13. The manufacturing method of a semiconductor device according to claim 1, wherein the buffer region includes a plurality of hydrogen donors, and the plurality of hydrogen donors include at least a Si-i-H defect where interstitial silicon (Si-i) and hydrogen are attached together.

14. A semiconductor device comprising:

a drift region of a first conductivity type provided in a semiconductor substrate; and a buffer region of a first conductivity type provided below the drift region and having a plurality of peaks of a doping concentration, the buffer region having:

a standard peak closest to a back surface among a peak group having peaks at depth positions that are more than or equal to 10 μm from the back surface of the semiconductor substrate; and a first deepest peak closest to a front surface of the semiconductor substrate among the peak group, wherein Xs is a depth position of an end portion on a side of a front surface of the standard peak, Xd1 is a depth position of an end portion on a side of a front surface of the first deepest peak, Xb is Xs+ (Xd1−Xs)×0.3, $n1$ is an integrated concentration of a doping concentration from a depth position Xs to Xb, $n2$ is an integrated concentration of a doping concentration from a depth position Xb to a Xd1, an oxygen chemical concentration of the semiconductor substrate is Co[$cm^{-3}$], a carbon chemical concentration of the semiconductor substrate is Cc[$cm^{-3}$], and in a semi-log graph whose vertical axis is an integrated concentration ratio (n2/(n1+n2)) and whose horizontal axis is a substrate concentration index (Co×[{Cc/(1E15)}×exp(Co/(1E17))]) [$cm^{-3}$], the semiconductor substrate has an oxygen chemical concentration and a carbon chemical concentration such that the substrate concentration index is in a range of more than or equal to 1E15 [$cm^{-3}$] and less than or equal to 1E22 [$cm^{-3}$], the integrated concentration ratio is in a range between an upper limit line A1 and a lower limit line B1, wherein the upper limit line $A1$: $y=2.259\text{E}-02\times ln(x)-4.900\text{E}-01$ and the lower limit line $B1$: $y=2.259\text{E}-02\times ln(x)-7.300\text{E}-01$.

15. The semiconductor device according to claim 14, wherein, in the semi-log graph, the integrated concentration ratio is in a range between an upper limit line A2 and a lower limit line B2, wherein the upper limit line $A2$: $y=2.259\text{E}-02\times ln(x)-5.400\text{E}-01$, and the lower limit line $B2$: $y=2.259\text{E}-02\times ln(x)-6.800\text{E}-01$.

16. The semiconductor device according to claim 14, wherein the semiconductor substrate has an oxygen chemical concentration and a carbon chemical concentration such that the substrate concentration index is in a range of more than or equal to 1E15 [$cm^{-3}$] and less than 2E17 [$cm^{-3}$].

17. The semiconductor device according to claim 14, wherein the semiconductor substrate has an oxygen chemical concentration and a carbon chemical concentration such that the substrate concentration index is in a range of more than or equal to 2E17 [$cm^{-3}$] and less than 5E19 [$cm^{-3}$].

18. The semiconductor device according to claim 14, wherein the semiconductor substrate has an oxygen chemical concentration and a carbon chemical concentration such that the substrate concentration index is in a range of more than or equal to 5E19 [$cm^{-3}$] and less than or equal to 1E22 [$cm^{-3}$].

19. The semiconductor device according to claim 14, wherein an oxygen chemical concentration of the semiconductor substrate is more than or equal to 1E17 [$cm^{-3}$] and less than or equal to 1E18 [$cm^{-3}$].

20. The semiconductor device according to claim 14, wherein a carbon chemical concentration of the semiconductor substrate is more than or equal to 0.05E16 [$cm^{-3}$] and less than or equal to 2.6E16 [$cm^{-3}$].

21. The semiconductor device according to claim 14, wherein $1<Xd1/Xd2\leq 20$ is met, Xd2 being a depth position of an end portion on a side of a front surface of a second deepest peak that is second closest to the front surface of the semiconductor substrate after the first deepest peak among the peak group.

22. The semiconductor device according to claim 14, wherein the semiconductor substrate is an MCZ substrate.

23. The semiconductor device according to claim 14, comprising:

a base region of a second conductivity type provided above the drift region;

an emitter region of a first conductivity type provided above the base region and having a higher doping concentration than the drift region;

a contact region of a second conductivity type provided above the base region and having a higher doping concentration than the base region; and a plurality of gate trench portions provided on the front surface of the semiconductor substrate.

24. The semiconductor device according to claim 14, wherein the buffer region includes a plurality of hydrogen donors, and the plurality of hydrogen donors include at least a Si-i-H defect where interstitial silicon (Si-i) and hydrogen are attached together.

25. A semiconductor device comprising:

a drift region of a first conductivity type provided in a semiconductor substrate including a front surface and a back surface, and a buffer region of a first conductivity type provided below the drift region and having a plurality of peaks of a doping concentration, the buffer region having:

a shallowest peak closest to a side of the back surface in a depth direction of the semiconductor substrate;

a standard peak closest to the back surface among a peak group provided closer to a side of the front surface than the shallowest peak and having three or more peaks at depth positions that are more than or equal to 10 μm from the back surface;

a first deepest peak closest to the front surface among the peak group; and a second deepest peak second closest to the front surface of the semiconductor substrate after the first deepest peak among the peak group, wherein Xs is a depth position of an end portion on a side of a front surface of the standard peak, Xd1 is a depth position of an end portion on a side of a front surface of the first deepest peak, Xd2 is a depth position of an end portion on a side of a front surface of the second deepest peak, a value obtained by dividing the Xd1 by the Xd2 is more than 1 and less than or equal to 20, and a value obtained by dividing a peak concentration of the first deepest peak by a peak concentration of the second deepest peak is more than or equal to 0.2 and less than or equal to 3.

26. The semiconductor device according to claim 25, wherein an integrated concentration integrating a doping concentration of the buffer region is more than or equal to $1.65\times10^{12}/cm^2$ and less than or equal to $2.8\times10^{12}/cm^2$.

27. The semiconductor device according to claim 25, wherein a substrate concentration index defined as (Co×[{Cc/(1E15)}×exp(Co/(1E17))]) [$cm^{-3}$] is more than or equal to 1E15 [$cm^{-3}$] and less than or equal to 1E22 [$cm^{-3}$], wherein an oxygen chemical concentration of the semiconductor substrate is Co[$cm^{-3}$] and a carbon chemical concentration of the semiconductor substrate is Cc[$cm^{-3}$].

28. The semiconductor device according to claim 25, wherein the buffer region includes a plurality of hydrogen donors, and the plurality of hydrogen donors include at least a Si-i-H defect where interstitial silicon (Si-i) and hydrogen are attached together.

* * * * *